United States Patent
Ryu et al.

(10) Patent No.: US 11,793,048 B2
(45) Date of Patent: Oct. 17, 2023

(54) LIGHT SHIELDING STRUCTURE AND DISPLAY PANEL HAVING THE SAME

(71) Applicant: Samsung Display Co., LTD., Yongin-si (KR)

(72) Inventors: Jang Wi Ryu, Yongin-si (KR); Byung-Chul Kim, Yongin-si (KR); Inseok Song, Pocheon-si (KR); Halim Ji, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 289 days.

(21) Appl. No.: 17/178,182

(22) Filed: Feb. 17, 2021

(65) Prior Publication Data

US 2021/0391389 A1 Dec. 16, 2021

(30) Foreign Application Priority Data

Jun. 11, 2020 (KR) .................. 10-2020-0071154

(51) Int. Cl.
*H10K 59/38* (2023.01)
*H10K 50/115* (2023.01)
*H10K 50/86* (2023.01)
*H10K 59/121* (2023.01)

(52) U.S. Cl.
CPC .......... *H10K 59/38* (2023.02); *H10K 50/115* (2023.02); *H10K 50/865* (2023.02); *H10K 59/121* (2023.02)

(58) Field of Classification Search
None
See application file for complete search history.

(56) References Cited

U.S. PATENT DOCUMENTS

| | | | |
|---|---|---|---|
| 10,379,395 B2 | 8/2019 | Lee et al. | |
| 2008/0042146 A1 | 2/2008 | Cok et al. | |
| 2016/0211311 A1* | 7/2016 | Sato | H01L 27/322 |
| 2017/0307932 A1* | 10/2017 | Lee | G02F 1/133553 |
| 2018/0156951 A1* | 6/2018 | Baek | G02F 1/133512 |
| 2019/0067607 A1* | 2/2019 | Park | H01L 51/5253 |

(Continued)

FOREIGN PATENT DOCUMENTS

| | | |
|---|---|---|
| KR | 1020160042679 A | 4/2016 |
| KR | 1020170122343 A | 11/2017 |

(Continued)

OTHER PUBLICATIONS

European Search Report for European Patent Application No. 21178889.8 dated Nov. 12, 2021.

*Primary Examiner* — Nduka E Ojeh
(74) *Attorney, Agent, or Firm* — CANTOR COLBURN LLP

(57) ABSTRACT

A display panel includes light emitting elements which generate source light, pixel regions from which light is emitted, a layer including light control patterns, and a layer including light shielding patterns which are in each of the pixel regions and are spaced apart from each other within a respective pixel region, where the light shielding patterns each includes a first light shielding pattern including a light shielding material, and a second light shielding pattern which corresponds to the first light shielding pattern, includes a metal material and is closer to the layer including the light control patterns than the first light shielding pattern.

20 Claims, 13 Drawing Sheets

(56) References Cited

U.S. PATENT DOCUMENTS

| | | |
|---|---|---|
| 2019/0072818 A1 | 3/2019 | Jung et al. |
| 2019/0179065 A1 | 6/2019 | Kim et al. |
| 2020/0119237 A1 | 4/2020 | Kim et al. |

FOREIGN PATENT DOCUMENTS

| | | |
|---|---|---|
| KR | 1020190027006 A | 3/2019 |
| WO | 2008/027178 A1 | 3/2008 |

* cited by examiner

LIGHT SHIELDING STRUCTURE AND DISPLAY PANEL HAVING THE SAME

This application claims priority to Korean Patent Application No. 10-2020-0071154, filed on Jun. 11, 2020, and all the benefits accruing therefrom under 35 U.S.C. § 119, the entire contents of which are hereby incorporated by reference.

BACKGROUND

(1) Field

The disclosure herein relates to a display panel, and more particularly, to a display panel having improved visibility.

(2) Description of the Related Art

Various display devices used in multimedia devices such as televisions, mobile phones, tablet computers, navigation devices and game consoles are being developed. These display devices include a display panel including a self-luminescent light emitting element in which a luminescent material emits light to implement image display.

To improve the visibility of the display panel, reflectivity of incident light from outside of the display device may be controlled. For example, the display device may reduce the reflectivity of the external light by including a retarder, a polarizer, etc.

SUMMARY

The disclosure provides a display panel having improved visibility.

An embodiment provides a display panel including a plurality of light emitting elements which generate source light, a first pixel region, a second pixel region and a third pixel region from which light is emitted, a peripheral region adjacent to the first pixel region, the second pixel region and the third pixel region, in order from the plurality of light emitting elements a layer including a first light control pattern, a second light control pattern and a third light control pattern which correspond to the first pixel region, the second pixel region and the third pixel region, respectively, and a layer including a first color filter, a second color filter and a third color filter which correspond to the first light control pattern, the second light control pattern and the third light control pattern, respectively, and a first divided pattern which transmits the source light, the first divided pattern including a first pattern corresponding to the peripheral region, and a second pattern corresponding to the first pixel region and the second pixel regions.

In an embodiment, the first divided pattern may transmit the source light and have an integrated shape with the third color filter.

In an embodiment, the display panel may further include a second divided pattern which shields the source light and includes a third pattern corresponding to the peripheral region, and a fourth pattern corresponding to the third pixel region.

In an embodiment, the second divided pattern may include a black material.

In an embodiment, the second divided pattern and the first divided pattern may be in order from the plurality of light emitting elements.

In an embodiment, the display panel may further include a first metal pattern which corresponds to the second pattern or the fourth pattern.

In an embodiment, the first metal pattern may have a mesh shape or square shape.

In an embodiment, the display panel may further include a second metal pattern which is extended along the boundary and in a direction away from the peripheral region, where the second metal pattern defines a first opening, a second opening and a third opening of the first pixel region, the second pixel region and the third pixel region, at which the first color filter, the second color filter and the third color filter are exposed outside of the second metal pattern, respectively.

In an embodiment, the display panel may further include a plurality of metal patterns which are in each of the first pixel region, the second pixel region and the third pixel region and are spaced apart from each other.

In an embodiment, the display panel may further include a third divided pattern which corresponds to the peripheral region and shields the source light, and is respectively between the first light control pattern, the second light control pattern and the third light control pattern.

In an embodiment, the third divided pattern may include a black material.

In an embodiment, the source light may be third color light, the first light control pattern may convert the third color light to first color light, the second light control pattern may convert the third color light to second color light, the third light control pattern may transmit the third color light, the first color filter may transmit the first color light, the second color filter may transmit the second color light, and the third color filter may transmit the third color light.

In an embodiment, the source light may be blue light.

In an embodiment, the plurality of light emitting elements each may include a first electrode, an organic layer which is on the first electrode and includes an emission layer, and a second electrode on the organic layer.

In an embodiment, the plurality of light emitting elements may include first, second and third light emitting elements corresponding to the first, second and third pixel regions, respectively, and the first, second and third light emitting elements may have an integrated shape.

In an embodiment, the first light control unit may include a base resin and a first quantum dot in the base resin, the second light control unit may include the base resin and a second quantum dot in the base resin, and a size of the first quantum dot may be larger than a size of the second quantum dot.

In an embodiment, a display panel includes a plurality of light emitting elements which generate source light, a first pixel region, a second pixel region and a third pixel region from which light is emitted, and in order from the plurality of light emitting elements a layer including a first light control pattern, a second light control pattern and a third light control pattern which correspond to the first pixel region, the second pixel region and the third pixel region, respectively, a color filter layer including a first color filter, a second color filter and a third color filter which correspond to the first light control pattern, the second light control pattern and the third light control pattern, respectively, and a layer including a plurality of light shielding patterns which are in each of the first pixel region, the second pixel region and the third pixel region and are spaced apart from each other within a respective pixel region, where the plurality of light shielding patterns each includes in order from the color filter layer a first light shielding pattern including a metal material, and a second light shielding pattern corresponding to the first light shielding pattern and including a light shielding material.

In an embodiment, the source light may be third color light, the first light control pattern may convert the third color light to first color light, the second light control pattern may convert the third color light to second color light, the third light control pattern may transmit the third color light, the first color filter may transmit the first color light, the second color filter may transmit the second color light, and a third color filter may transmit the third color light.

In an embodiment, a display panel includes a plurality of light emitting elements which generate source light, a first pixel region, a second pixel region and a third pixel region from which light is emitted, a peripheral region adjacent to the first pixel region, the second pixel region and the third pixel region, a layer including a first light control pattern, a second light control pattern and a third light control pattern which correspond to the first pixel region, the second pixel region and the third pixel region, respectively, and a layer including a plurality of light shielding patterns which are in each of the first pixel region, the second pixel region and the third pixel region and are spaced apart from each other within a respective pixel region, where the plurality of light shielding patterns each includes a first light shielding pattern including a light shielding material, and a second light shielding pattern which corresponds to the first light shielding pattern, includes a metal material and is closer to the layer including the first light control pattern, the second light control pattern and the third light control pattern than the first light shielding pattern.

In an embodiment, the source light may be blue light, and the first light shielding pattern may include a blue material or a black material.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain embodiment of the invention. In the drawings.

DETAILED DESCRIPTION

Figure 1A:
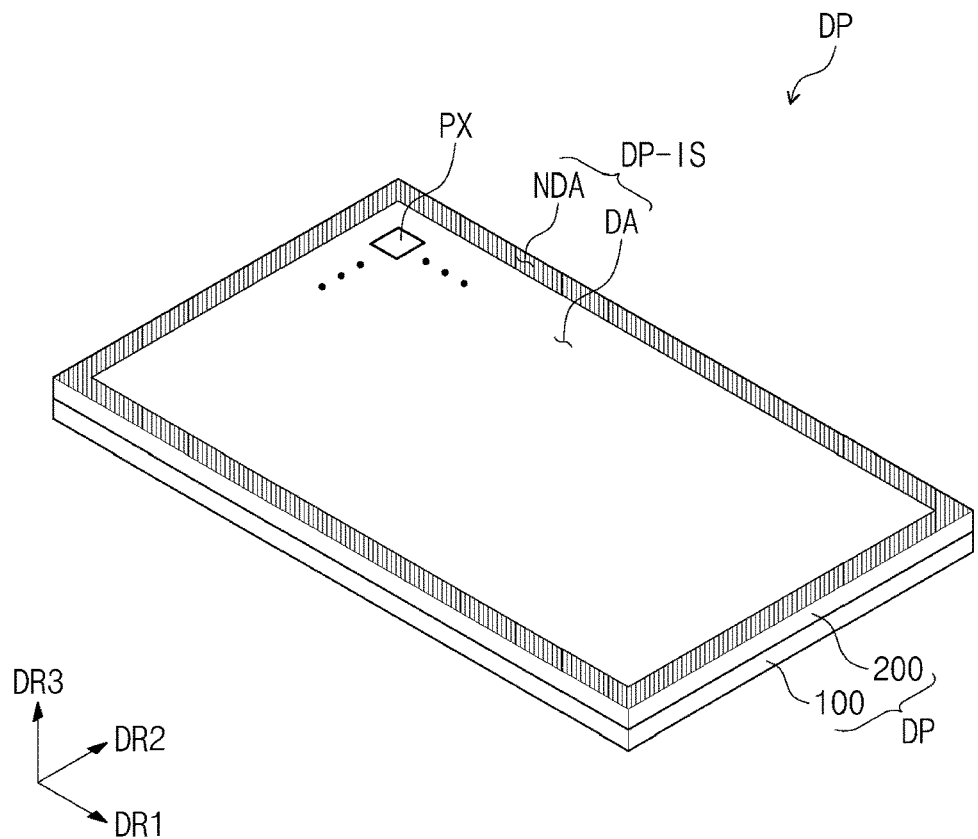
FIG. 1A is a perspective view of an embodiment of a display panel.

The invention may have various modifications and may be embodied in different forms, and embodiments will be explained in detail with reference to the accompanying drawings. The invention may, however, be embodied in different forms and should not be construed as limited to the embodiments set forth herein. Rather, all modifications, equivalents, and substituents which are included in the spirit and technical scope of the invention should be included in invention. Like reference numerals refer to like elements throughout.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. The terms of a singular form may include plural forms unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and should be expressly defined herein unless they are interpreted in an ideal or overly formal sense.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It should be understood that the terms "comprise," or "have" are intended to specify the presence of stated features, integers, steps, operations, elements, components, or combinations thereof in the disclosure, but do not preclude the presence or addition of one or more other features, integers, steps, operations, elements, components, or combinations thereof.

In the present application, when a layer, a film, a region, or a plate is referred to as being "above" or "in an upper portion" another layer, film, region, or plate, it can be not only directly on the layer, film, region, or plate, but intervening layers, films, regions, or plates may also be present. Similarly, when a layer, a film, a region, or a plate is referred to as being "below," "in a lower portion of" another layer, film, region, or plate, it can be not only directly under the layer, film, region, or plate, but intervening layers, films, regions, or plates may also be present. In addition, it will be understood that when a layer, a film, a region, or a plate is referred to as being "on" another layer, film, region, or plate, it can be not only disposed above the layer, film, region, or plate, but also disposed under the layer, film, region, or plate.

As used herein, elements described as being related to each other such as being "directly contacted to" herein means that there are no intervening layers, films, regions, plates, or the like between a part such as a layer, a film, a region, and a plate and another part. For example, being "directly contacted to" may mean that an additional constitution such as an adhesive layer is not disposed between two layers.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display panel DP will be described with reference to the accompanying drawings.

Figure 1B:
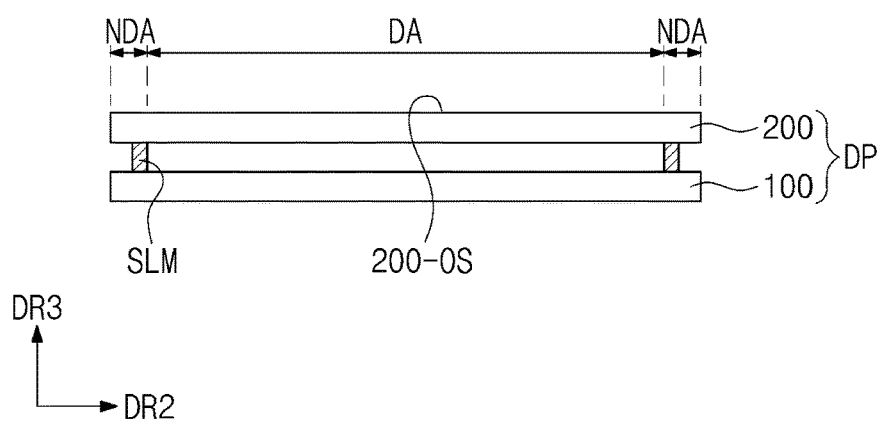
FIG. 1B is a cross-sectional view of an embodiment of a display panel.
Figure 2:
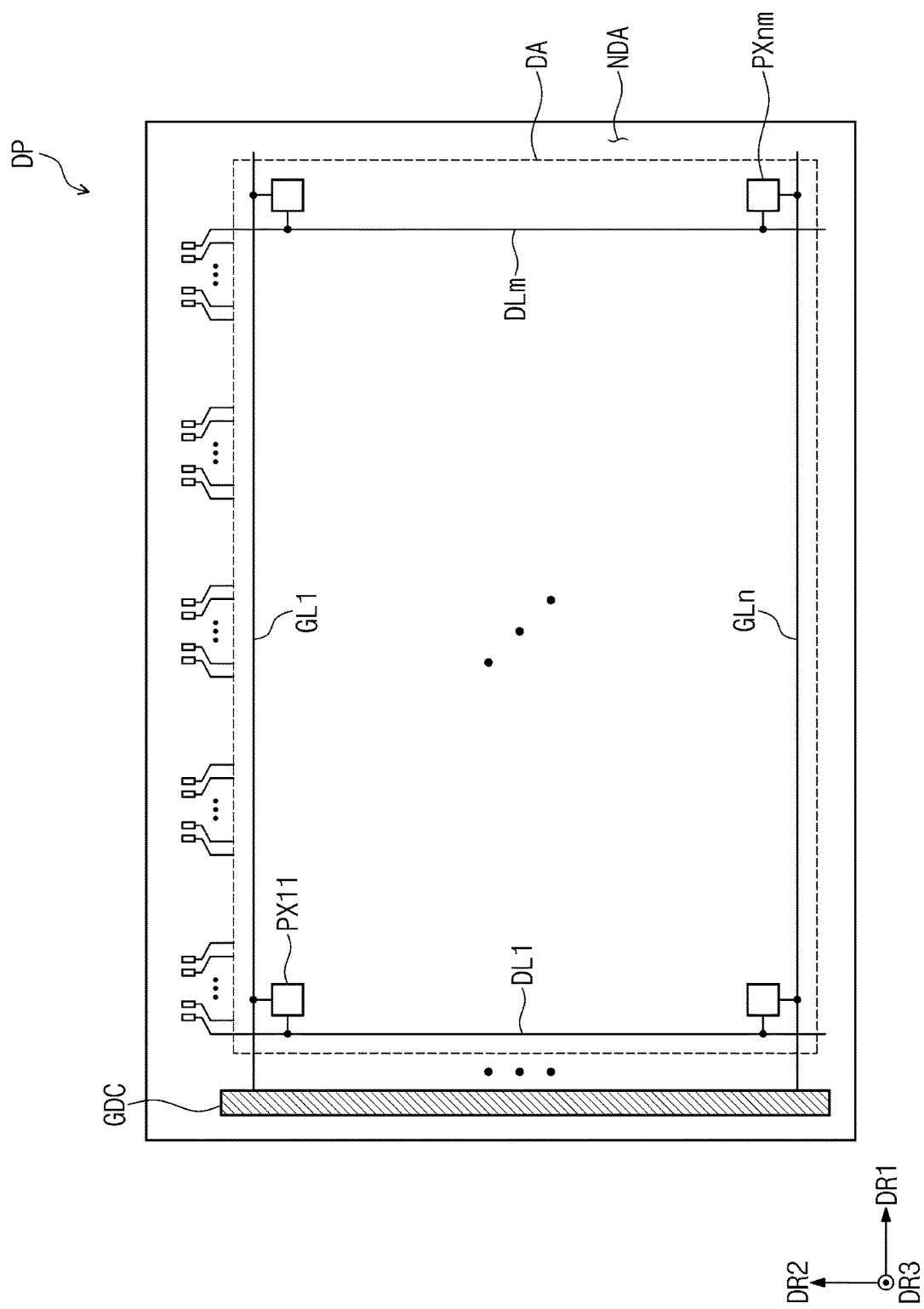
FIG. 2 is a plan view of an embodiment of a display panel.

FIG. 1A is a perspective view of an embodiment of a display panel DP. FIG. 1B is a cross-sectional view of an embodiment of a display panel DP. FIG. 2 is a plan view of an embodiment of a display panel DP.

Referring to FIGS. 1A, 1B and 2, a display panel DP may be any one of a liquid crystal display panel, an electrophoretic display panel, a microelectromechanical system display panel, an electrowetting display panel or an organic light emitting display panel, and is not particularly limited thereto.

Although not separately illustrated, the display panel DP may further include a sash or molding, and may further include a back light unit which generates light used by the display panel DP, according to a type of the display panel DP.

The display panel DP may include a first substrate 100 (or a lower display substrate), and a second substrate 200 (or an upper display substrate) facing and spaced apart from the first substrate 100 along a thickness direction of the display panel DP. A cell gap may be defined or formed between the first substrate 100 and the second substrate 200. The cell gap may be maintained by a sealant SLM (e.g., sealing member) which couples the first substrate 100 and the second substrate 200 to each other. A gray scale display layer for generating an image may be disposed between the first substrate 100 and the second substrate 200. The gray scale display layer may include a liquid crystal layer, an organic emission layer or an electrophoretic layer according to a type of the display panel DP.

As shown in FIG. 1A, a display panel DP may display an image through a display surface DP-IS. An outer surface 200-OS of the second substrate 200 illustrated in FIG. 1B may define the display surface DP-IS of the display panel DP.

The display surface DP-IS is parallel to a plane defined by a first direction DR1 and a second direction DR2 crossing each other. The display surface DP-IS may include a display region DA and a non-display region NDA. A pixel PX may be provided in plural including pixels PX disposed in the display region DA. In an embodiment, pixels PX are not disposed in the non-display region NDA. The non-display region NDA is defined along an edge of the display surface DP-IS. The non-display region NDA is adjacent to the display region DA. In an embodiment, the display region DA may be surrounded by the non-display region NDA in the plan view. In an embodiment, the non-display region NDA may be omitted or disposed at only one side of the display region DA. The display panel DP and various components or layers thereof may include the display region DA and the non-display region NDA discussed above.

A normal direction relative to the display surface DP-IS, that is, the thickness direction of the display panel DP is indicated by a third direction DR3 crossing each of the first direction DR1 and the second direction DR2. A front surface (or an upper surface) and a rear surface (or a lower surface) of each of layers or units described below are distinguished along the third direction DR3. However, the first to third directions DR1, DR2 and DR3 shown are merely examples.

In an embodiment, a display panel DP having a display surface DP-IS which is flat is illustrated, but the invention is not limited thereto. The display panel DP may include a curved display surface or a three-dimensional display surface. The three-dimensional display surface may include a plurality of display areas or regions respective extended along different directions from each other.

FIG. 2 illustrates an embodiment of a planar arrangement of signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

The pixels PX11 to PXnm are respectively connected to corresponding gate lines of the plurality of the gate lines GL1 to GLn and corresponding data lines of the plurality of the data lines DL1 to DLm. Each of the pixels PX11 to PXnm may include a pixel driving circuit and a display device (e.g., display element). According to the configuration of the pixel driving circuit of the pixels PX11 to PXnm, more types of signal lines may be provided in the display panel DP.

The pixels PX11 to PXnm in the form of a matrix within the display region DA are exemplarily illustrated, but are not limited thereto. The pixels PX11 to PXnm may be disposed in the form of a pentile. The pixels PX11 to PXnm may be disposed in the form of a diamond. A gate driving circuit GDC may be integrated in the display panel DP such as through an oxide silicon gate driver circuit ("OSG") or an amorphous silicon gate driver circuit ("ASG") process.

Figure 3:
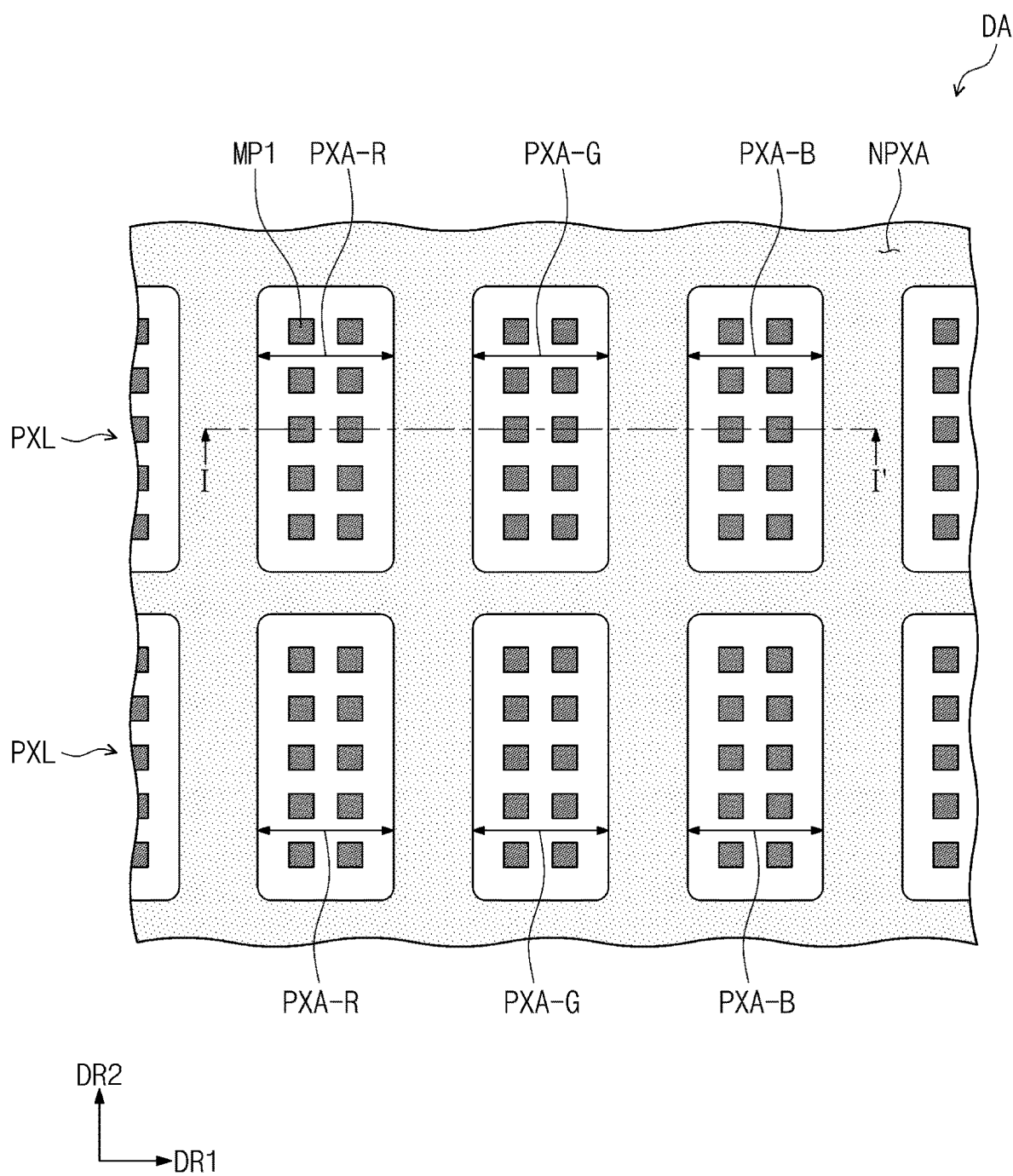
FIG. 3 is a plan view of an embodiment of a display region of a display panel.
Figure 4:
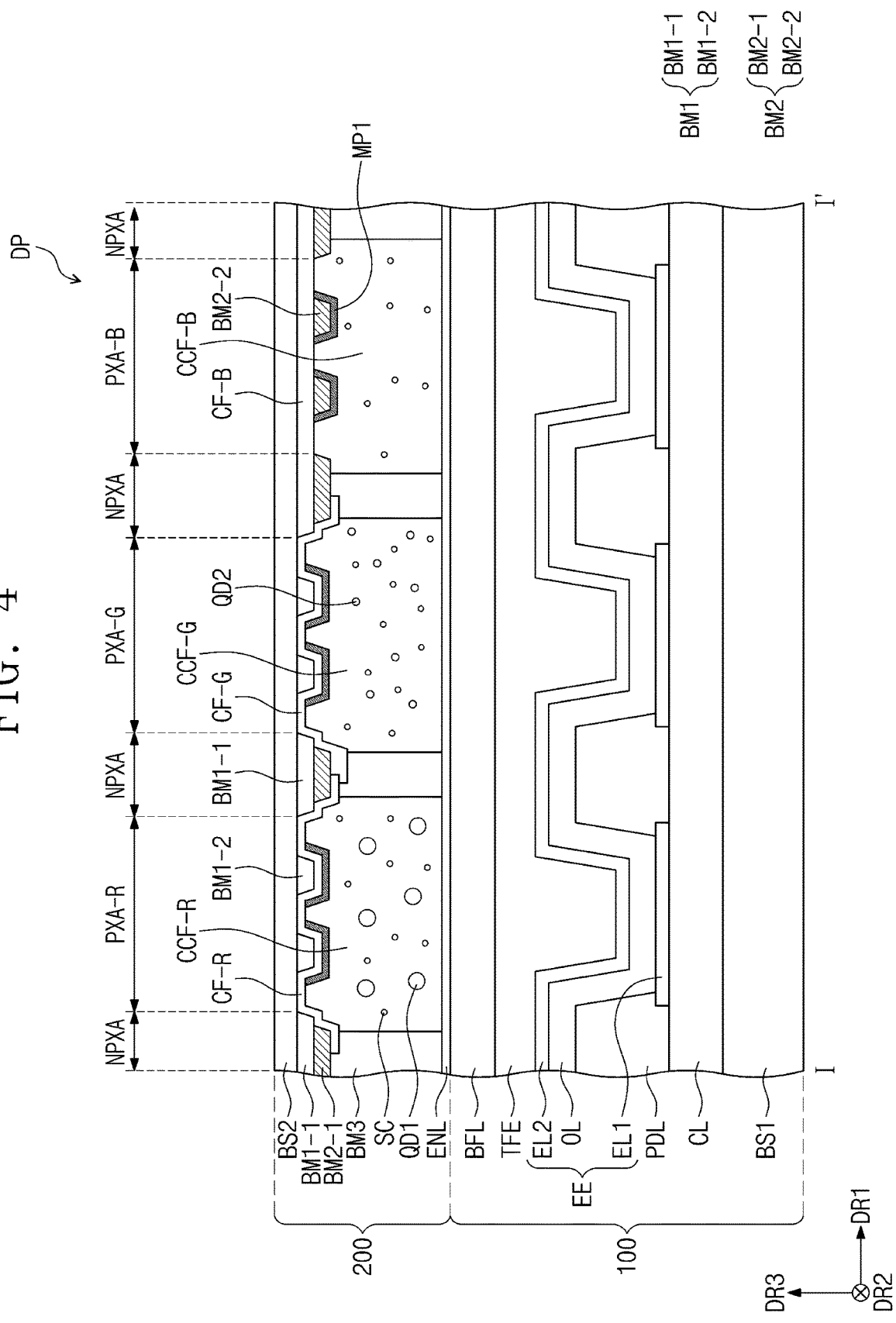
FIG. 4 is a cross-sectional view taken along line I-I' of FIG. 3.

FIG. 3 is a plan view of an embodiment of a display region DA. FIG. 4 is a cross-sectional view taken along line I-I' of FIG. 3.

FIG. 3 exemplarily illustrates first to third pixel regions PXA-R, PXA-G and PXA-B which are included in two "rows of pixels" PXL to define six pixel regions. In an embodiment, the first to third pixel regions PXA-R, PXA-G and PXA-B shown in FIG. 3 may be repeatedly disposed in an entirety of the display region DA.

A peripheral region NPXA (e.g., pixel peripheral region) is disposed adjacent to each of the first to third pixel regions PXA-R, PXA-G and PXA-B. The peripheral region NPXA defines boundaries of the first to third pixel regions PXA-R, PXA-G and PXA-B. In an embodiment, the peripheral region NPXA may surround all of the first to third pixel regions PXA-R, PXA-G and PXA-B. A structure which reduces or effectively prevents a color mixing among the first to third pixel regions PXA-R, PXA-G and PXA-B, such as by absorbing and/or blocking light, may be disposed in the peripheral region NPXA.

One among the first to third pixel regions PXA-R, PXA-G and PXA-B provides third color light corresponding to a source light, another one provides first color light different from the third color light, and the third one provides second color light different from the third color light and the first color light. In an embodiment, a third pixel region PXA-B provides the third color light In an embodiment, a first pixel region PXA-R may provide red light, a second pixel region PXA-G may provide green light, and the third pixel region PXA-B may provide blue light.

In FIG. 3, the first to third pixel regions PXA-R, PXA-G and PXA-B having a same planar area as each other are exemplarily illustrated, but are not limited thereto. At least two among the first to third pixel regions PXA-R, PXA-G and PXA-B may have different planar areas from each other. The planar area of the first to third pixel regions PXA-R, PXA-G and PXA-B may be set according to the color of light generated and/or emitted therefrom. Among the first to third pixel regions PXA-R, PXA-G and PXA-B in consideration of primary colors, the planar area of the pixel region which emits red light may be the largest, and the planar area of the pixel region which emits blue light may be the smallest.

As shown in FIG. 3, a pixel PX is stripe-shaped in which the first to third pixel regions PXA-R, PXA-G and PXA-B each having a rectangular planar shape (substantially rectangular shape) with rounded corners in the plan view are illustrated, but the invention is not limited thereto. Along the plane defined by the first direction DR1 and the second direction DR2 crossing each other, the first to third pixel regions PXA-R, PXA-G and PXA-B may respectively have another polygonal planar shape (substantially polygonal shape) such as a diamond or a pentagon. The stripe shape may be defined along a pixel row extended along the first direction DR1.

A first metal pattern MP1 which is provided in plural including a plurality of first metal patterns MP1 may be disposed to overlap or correspond to each of the first to third pixel regions PXA-R, PXA-G and PXA-B. In an embodiment, the first metal patterns MP1 may reflect incident light from outside the display panel DP, by including a metal material. A group of the first metal patterns MP1 may respectively overlap or correspond to the first to third pixel regions PXA-R, PXA-G and PXA-B. Within a respective pixel region, the first metal patterns MP1 of the group may be spaced apart from each other. That is, the first metal patterns MP1 may overlap a first portion of the first to third pixel regions PXA-R, PXA-G and PXA-B, and expose a second portion of the first to third pixel regions PXA-R, PXA-G and PXA-B to outside the first metal patterns MP1.

The first metal patterns MP1 are illustrated to have a square shape on a plane, but the invention is not limited thereto. The first metal patterns MP1 may include a single layer or a plurality of layers. In addition, FIG. 3 illustrates only the first metal patterns MP1, but an embodiment of the display panel DP may further include patterns which include a light shielding material and overlap the first metal patterns MP1 to provide a light shielding function at a respective pixel region. This will be described in detail with reference to FIG. 4.

FIGS. 3 and 4 illustrate that a plurality of the first metal patterns MP1 are disposed within a single pixel region, but the invention is not limited thereto. In an embodiment, a single one or a plurality of first metal patterns MP1 may be disposed within a single pixel region, such that the invention is not limited to a number of the first metal patterns MP1 and the number may be varied within the scope of the invention.

One or more embodiment of the display region DA may increase reflectivity of light generated from inside of the display panel DP by including the first metal patterns MP1 overlapping or corresponding to the first to third pixel regions PXA-R, PXA-G and PXA-B.

Referring to FIG. 4, the display panel DP may include the first substrate 100 and the second substrate 200.

In an embodiment, the first substrate 100 may include a first base substrate BS1, a circuit layer CL, a plurality of light emitting elements EE (e.g., light emitting element layer or display element layer), a thin film encapsulation layer TFE (e.g., first encapsulation layer), and a buffer layer BFL are sequentially stacked in order along the third direction DR3. However, the constitution of the first substrate 100 is not limited thereto.

The first base substrate BS1 may provide a base surface on which a plurality of light emitting elements EE are disposed. The first base substrate BS1 may include a synthetic resin substrate or a glass substrate. The first base substrate BS1 may be rigid or flexible. In an embodiment, the first base substrate BS1 may be rigid. However, the invention is not limited thereto.

The circuit layer CL may be disposed on the first base substrate BS1. The circuit layer CL may include a plurality of transistors (not shown). Each of the transistors (not shown) may include a control electrode, an input electrode and an output electrode. In an embodiment, for example, the circuit layer CL may include a switching transistor and a driving transistor for driving the plurality of light emitting elements EE.

A pixel defining film PDL (e.g., pixel defining layer) may be disposed on the circuit layer CL. The pixel defining film PDL may define the boundaries of the first to third pixel regions PXA-R, PXA-G and PXA-B. The first to third pixel regions PXA-R, PXA-G and PXA-B and the peripheral region NPXA may be divided by the pixel defining film PDL. The pixel defining film PDL may overlap or correspond to the peripheral region NPXA In an embodiment, for example, the pixel defining film PDL may include an organic material. The pixel defining film PDL may include a polyacrylate-based resin or a polyimide-based resin.

The pixel defining film PDL may alternatively or additionally include an inorganic material. In an embodiment, for example, the pixel defining film PDL may include or be formed by including silicon nitride ($SiN_x$), silicon oxide ($SiO_x$), silicon oxynitride ($SiO_xN_y$), etc.

A light emitting element among the plurality of light emitting elements EE which is disposed in the first pixel region PXA-R may be defined as a first light emitting element. A light emitting element among the plurality of light emitting elements EE which is disposed in the second pixel region PXA-G may be defined as a second light emitting element. A light emitting element among the plurality of light emitting elements EE which is disposed in the third pixel region PXA-B may be defined as a third light emitting element. In an embodiment, the first to third light emitting elements may generate and/or emit a source light. The first substrate 100 may emit the source light generated from the plurality of light emitting elements EE.

The plurality of light emitting elements EE each may include a first electrode EL1, a second electrode EL2 and at least one of an organic layer OL (e.g., emission layer). One or more of the first electrode EL1, the second electrode EL2 and the organic layer OL may be provided in plural along the first base substrate BS1. The first electrodes EL1 may be disposed along the circuit layer CL. The first electrode EL1 may be electrically connected to the driving transistor (not shown) to receive a driving signal. The first electrodes EL1 may be respectively disposed between the plurality of pixel defining films PDL to be spaced apart from each other along the first base substrate BS1. The second electrode EL2 may be disposed along the first electrodes EL1. At least one of the organic layer OL may be disposed between the first electrode EL1 and the second electrode EL2 along the third direction DR3.

The first electrode EL1 and the second electrode EL2 within a light emitting element EE among the plurality of light emitting elements EE may have conductivity. The first electrode EL1 and the second electrode EL2 may include or be formed of a metal alloy or a conductive material. The first electrode EL1 may be an anode. The first electrode EL1 may be a pixel electrode. The second electrode EL2 may be a cathode. The second electrode EL2 may be a common electrode.

In an embodiment of the light emitting element EE, the first electrode EL1 and the second electrode EL2 may be one of a reflective electrode, a transmissive electrode and a transflective electrode. In an embodiment, the first electrode EL1 of the light emitting element EE may be the reflective electrode, and the second electrode EL2 may be the transmissive electrode or the transflective electrode. In an embodiment, for example, the second electrode EL2 may include Ag, Mg, Cu, Al, Pt, Pd, Au, Ni, Nd, Ir, Cr, Li, Ca, LiF, Mo, Ti, Yb, or a combination thereof (e.g., AgMg, AgYb, or MgAg). Alternatively, the second electrode EL2 may have a multilayer structure including a reflective film or a transflective film including or formed of the above-described materials, and a transparent conductive film including or formed of indium tin oxide ("ITO"), indium zinc oxide ("IZO"), zinc oxide (ZnO), indium tin zinc oxide ("ITZO"), etc.

The organic layer OL may include a hole transport region and an electron transport region. However, the invention is not limited thereto, and the hole transport region may include a hole injection layer and a hole transport layer. The electron transport region may include an electron injection layer and an electron transport layer. The organic layer OL may further include at least one emission layer and a charge generation layer.

The emission layer may have a single layer including or formed of a single material, a single layer including or formed of a plurality of different materials, or a multilayer structure having a plurality of layers including or formed of a plurality of different materials. When the display panel DP is an organic electroluminescence display panel, the organic layer OL may include anthracene derivatives, pyrene derivatives, fluoranthene derivatives, chrysene derivatives, dehydrobenzanthracene derivatives, or triphenylene derivatives. Specifically, the emission layer may include anthracene derivatives or pyrene derivatives.

When the display panel DP is an organic electroluminescence display panel, the organic layer OL may include a host and a dopant. Specifically, the emission layer of the organic layer OL may include a host and a dopant. In an embodiment, for example, the emission layer may include, as a host material, at least one of bis[2-(diphenylphosphino)phenyl] ether oxide (DPEPO), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(N-phenylbenzimidazole-2-yl)benzene (TPBi). However, the invention is not limited thereto, for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4', 4"-Tris(carbazol-9-yl)-triphenylamine (TCTA), 1,3,5-tris (N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as a host material.

In addition, the emission layer may include, as a dopant material, styryl derivatives (e.g., 1,4-bis[2-(3-N-ethylcarbazoryl)vinyl]benzene ($BC_zVB$), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl) phenyl)-N-phenylbenzen amine (N-BDAVBi)), perylene and the derivatives thereof (e.g., 2,5,8,11-tetra-t-butylperylene (TBP)), pyrene and the derivatives thereof (e.g., 1,1'-dipyrene, 1,4-dipyrenylbenzene, 1,4-bis(N,N-diphenylamino)pyrene), etc.

When the emission layer includes a quantum dot, the core of the quantum dot may be a Group II-VI compound, a Group III-VI compound, a Group III-V compound, a Group IV-VI compound, a Group IV compound, ,a Group I—III-VI compound or a combination thereof.

The Group II-VI compound may be selected from a binary compound selected from CdS, CdSe, CdTe, ZnS, ZnSe, ZnTe, ZnO, HgS, HgSe, HgTe, MgSe, MgS, and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary compound selected from CdZnSeS, CdZnSeTe, CdZnSTe, CdHgSeS, CdHgSeTe, CdHgSTe, HgZnSeS, HgZnSeTe, HgZnSTe, and a combination thereof.

The Group III-VI compound may include a binary compound such as $In_2S_3$ and $In_2Se_3$, a ternary compound such as $InGaS_3$ and $InGaSe_3$, or any combination thereof.

The Group III-V compound may be selected from a binary compound selected from GaN, GaP, GaAs, GaSb, AlN, AlP, AlAs, AlSb, InN, InP, InAs, InSb, and a combination thereof, a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V semiconductor compound may further include Group II metals (e.g., InZnP, etc.).

The Group IV-VI compound may be selected from a binary compound selected from SnS, SnSe, SnTe, PbS, PbSe, PbTe, and a combination thereof a ternary compound selected from SnSeS, SnSeTe, SnSTe, PbSeS, PbSeTe, PbSTe, SnPbS, SnPbSe, SnPbTe, and a combination thereof, and a quaternary compound selected from Si, Ge, and a combination thereof. The Group IV compound may be a binary compound selected from SiC, SiGe, and a combination thereof.

The Group I-III-VI semiconductor compound may include a ternary compound such as AgInS, $AgInS_2$, CuInS, $CuInS_2$, $CuGaO_2$, $AgGaO_2$, and $AgAlO_2$, or any combination thereof.

A binary compound, a ternary compound or a quaternary compound may be present in a particle with a uniform concentration distribution, or may be present in the same particle with a partially different concentration. In addition, a quantum dot may have a core/shell structure in which one quantum dot surrounds another quantum dot. An interface between a core and a shell may have a concentration gradient in which the concentration of an element present in the shell becomes lower toward the center.

In embodiments, a quantum dot may have the above-described core-shell structure including a core having nanocrystals and a shell surrounding the core. The shell of the quantum dot may serve as a protective layer to reduce or effectively prevent the chemical deformation of the core so as to maintain semiconductor properties, and/or a charging layer to impart electrophoresis properties to the quantum dot. The shell may be a single layer or multiple layers. An interface between a core and a shell may have a concentration gradient in which the concentration of an element present in the shell becomes lower toward the center. An example of the shell of the quantum dot may be a metal or non-metal oxide, a semiconductor compound, or a combination thereof.

In an embodiment, for example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the invention is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the invention is not limited thereto.

A quantum dot may have a full width of half maximum ("FWHM") of a light emission wavelength spectrum of about 45 nanometers (nm) or less, such as about 40 nm or less or, about 30 nm or less, where color purity or color reproducibility may be improved in the above range. In addition, light emitted through such quantum dot is emitted in all directions so that a wide viewing angle may be improved.

In addition, since the form or shape of a quantum dot is not particularly limited, a quantum dot in the form of spherical, pyramidal, multi-arm, or cubic nanoparticles, nanotubes, nanowires, nanofibers, nanoplates, etc. may be used.

A quantum dot may control the color of emitted light according to a size thereof. Accordingly, the quantum dot may have various light emission colors such as blue, red and green. In an embodiment, the emission layer may emit source light In an embodiment, for example, when the display panel DP is an organic electroluminescence display panel, the emission layer may include or be formed of an organic material which emits blue light, and may include a fluorescent material or a phosphorescent material. However, the invention is not limited thereto.

The hole transport region, the emission layer and the electron transport region may each be provided as a common layer for an entirety of the light emitting elements EE. In contrast, the first electrode EL1 is provided as a plurality of patterns spaced apart from each other along the circuit layer CL.

In an embodiment, at least one of the hole transport region, the emission layer and the electron transport region may be provided or formed as a pattern corresponding to a respective one of the light emitting element EE.

The thin film encapsulation layer TFE may be disposed on the second electrode EL2. The thin film encapsulation layer TFE may cover the light emitting elements EE. The thin film encapsulation layer TFE may be directly disposed on the second electrode EL2, without being limited thereto. When the light emitting element EE further includes a capping layer, the thin film encapsulation layer TFE may be directly disposed on the capping layer.

In an embodiment, the thin film encapsulation layer TFE may include two inorganic material layers and an organic material layer disposed therebetween. Alternatively, the thin film encapsulation layer TFE may include a plurality of inorganic material layers and a plurality of organic material layers which are alternately stacked. In the thin film encapsulation layer TFE, the inorganic material layer may protect the plurality of light emitting elements EE from moisture and oxygen, and the organic material layer may protect the light emitting elements EE from foreign substances such as dust particles.

The first substrate 100 may further include a buffer layer BFL. The buffer layer BFL may be disposed on the thin film encapsulation layer TFE. The buffer layer BFL may protect the first substrate 100 from external impact or impurities.

The second substrate 200 may be disposed facing the first substrate 100. The second substrate 200 may include a second base substrate BS2, and a first divided pattern BM1 (e.g., first color pattern), a second divided pattern BM2 (e.g., second color pattern), a third divided pattern BM3 (e.g., third color pattern), first to third color filters CF-R, CF-G and CF-B (e.g., color filter layer), and first to third light control units CCF-R, CCF-G, and CCF-B (e.g., light control layer) which are disposed on the second base substrate BS2.

The second substrate 200 may further include an encapsulation layer ENL (e.g., second encapsulation layer). In the display panel DP of FIG. 4, only the encapsulation layer ENL contacting to the first substrate 100 is illustrated, but the invention is not limited thereto. In an embodiment, a plurality of encapsulation layers which seal each constitution of the second substrate 200 may be included. The encapsulation layer ENL may serve to reduce or effectively prevent the penetration of moisture and/or oxygen (hereinafter, referred to as "moisture/oxygen"). The encapsulation layer ENL may include at least one of an organic material and an inorganic material. The encapsulation layer ENL may include a single layer or a plurality of layers.

The first to third light control units CCF-R, CCF-G and CCF-B may be disposed on a bottom surface of the second base substrate BS2. The first to third light control units CCF-R, CCF-G and CCF-B may absorb and/or transmit the source light. In an embodiment, the source light may be third color light. Hereinafter, the source light will be described as the third color light.

The first light control unit CCF-R (e.g., first light control pattern) may absorb the third color light and emit the first color light. The second light control unit CCF-G (e.g., second light control pattern) may absorb the third color light and emit the second color light. The third light control unit CCF-B (e.g., third light control pattern) may transmit the third color light. In an embodiment, for example, the first color light may be red light having a center wavelength of about 600 nm to about 670 nm. The second color light may be green light having a center wavelength of about 500 nm to about 580 nm. The third color light may be blue light having a center wavelength of about 420 nm to about 480 nm. In an embodiment, the display panel DP may include in order from the plurality of light emitting elements EE, a layer including a first light control pattern, a second light control pattern and a third light control pattern which correspond to the first pixel region PXA-R, the second pixel region PXA-G and the third pixel region PXA-B, respectively, and a layer including a first color filter CF-R, a second color filter CF-G and a third color filter CF-B which correspond to the first light control pattern, the second light control pattern and the third light control pattern, respectively.

The first to third light control units CCF-R, CCF-G and CCF-B may be disposed corresponding to the first pixel region PXA-R, the second pixel region PXA-G, and the third pixel region PXA-B, respectively. The first to third light control units CCF-R, CCF-G and CCF-B may overlap or correspond to the first pixel region PXA-R, the second pixel region PXA-G and the third pixel region PXA-B, respectively.

The first light control unit CCF-R may include a first base resin, a first quantum dot QD1 and a scattering particle SC provided in plural including scattering particles SC. The first quantum dot QD1 and the scattering particles SC may be dispersed in the first base resin. The scattering particles SC may include $TiO_2$ or silica-based nanoparticles. However, the invention is not limited thereto.

The scattering particles SC may scatter light (e.g., light scattering particle). In an embodiment, for example, the scattering particles SC may scatter the first color light, the second color light and the third color light inside the display panel DP. In addition, the scattering particles SC may scatter incident light which travels from outside the display panel DP and into the display panel DP.

The first quantum dot QD1 may absorb the third color light and emit the first color light. Since the same descriptions on the quantum dot included in the emission layer as described above may be applied with respect to the first quantum dot QD1, the detailed descriptions will be omitted.

The second light control unit CCF-G may include a second base resin, a second quantum dot QD2 and scattering particles SC. The second quantum dot QD2 and the scattering particles SC may be dispersed in the second base resin. The second quantum dot QD2 may absorb the third color light and emit the second color light. Since the same descriptions on the quantum dot included in the emission layer as described above may be applied with respect to the second quantum dot QD2, the detailed descriptions will be omitted.

The third light control unit CCF-B may include a third base resin and scattering particles SC. The third light control unit CCF-B excludes a quantum dot, and thus the third color light emitted from the plurality of light emitting elements EE may be transmitted without absorption, color conversion, etc.

The first to third color filters CF-R, CF-G and CF-B may be disposed on the bottom surface of the second base substrate BS2 which is closest to the plurality of light emitting elements EE. The first to third color filters CF-R, CF-G and CF-B may be disposed between the second base substrate BS2, and the first to third light control units CCF-R, CCF-G and CCF-B, respectively.

The first to third color filters CF-R, CF-G and CF-B may be disposed corresponding to the first pixel region PXA-R, the second pixel region PXA-G and the third pixel region PXA-B, respectively. The first to third color filters CF-R, CF-G and CF-B may overlap or correspond to the first pixel region PXA-R, the second pixel region PXA-G and the third pixel region PXA-B, respectively.

The first to third color filters CF-R, CF-G and CF-B include a pigment and/or a dye which absorbs light in different wavelength bands. The first color filter CF-R may be a red color filter, the second color filter CF-G may be a green color filter and the third color filter CF-B may be a blue color filter.

The first to third color filters CF-R, CF-G and CF-B reduce the reflectivity of the external light from outside the display panel DP. The first to third color filters CF-R, CF-G and CF-B each transmit light in a wavelength range and block light which is outside the wavelength range.

Referring to FIG. 4, the display panel DP may include the first divided pattern BM1, the second divided pattern BM2 and the third divided pattern BM3.

The first divided pattern BM1 may be directly on the bottom surface of the second base substrate BS2. The first divided pattern BM1 may form an interface with the bottom surface of the second base substrate BS2. The first divided pattern BM1 may include substantially a same material as the third color filter CF-B. In an embodiment, for example, the first divided pattern BM1 may include a blue material, for example, a blue pigment, a blue dye or the like. In an embodiment, for example, the first divided pattern BM1 may have an integrated shape with the third color filter CF-B along the second base substrate BS2. As having an integrated shape, the first divided pattern BM1 may be in a same layer as the third color filter CF-B, that is, a first color pattern layer, and connected thereto. As being in a same layer, elements may be respective portions or patterns of a same material layer.

The first divided pattern BM1 includes a first pattern BM1-1 disposed to overlap or correspond to the peripheral region NPXA and a second pattern BM1-2 disposed to overlap or correspond to the first pixel region PXA-R and the second pixel region PXA-G. Each of the first pattern BM1-1 and the second pattern BM1-2 of the first divided pattern BM1 may have an integrated shape with the third color filter CF-B. A single one or a plurality of the second pattern BM1-2 may be disposed corresponding to a respective pixel region.

Hereinafter, the plurality of first patterns BM1-1 and the plurality of second patterns BM1-2 will be described as an example.

The second patterns BM1-2 may be disposed to overlap or correspond to each of the first pixel region PXA-R and the second pixel region PXA-G and may be disposed to be spaced apart from each other in each respective pixel region. That is, the second patterns BM1-2 may overlap or correspond to a first portion of the first pixel region PXA-R and the second pixel region PXA-G and expose a second portion of the first pixel region PXA-R and the second pixel region PXA-G to outside the second patterns BM1-2.

In the drawings, two of the second patterns BM1-2 are illustrated, but the invention is not limited thereto. In an embodiment, one or three or more of the second patterns BM1-2 may be disposed in each of the first pixel region PXA-R and the second pixel region PXA-G.

The first pattern BM1-1 and the second pattern BM1-2 may have different positions disposed in the display panel DP, but may include a same material as each other.

The second divided pattern BM2 may be on the bottom surface of the second base substrate BS2. The second divided pattern BM2 may be disposed on the bottom surface of the first divided pattern BM1. The second divided pattern BM2 may face second base substrate BS2 with the first divided pattern BM1 therebetween.

The second divided pattern BM2 may include a light shielding material. In an embodiment, for example, the second divided pattern BM2 may include a black material. In an embodiment, for example, the second divided pattern BM2 may include a black pigment and a black dye. The black material may include carbon black, a metal such as chrome (Cr) or an oxide thereof.

The second divided pattern BM2 includes a third pattern BM2-1 provided in plural including a plurality of third patterns BM2-1 and a fourth pattern BM2-2 provided in plural including a plurality of fourth patterns BM2-2. The third patterns BM2-1 may be disposed to overlap or correspond to the peripheral region NPXA. That is, the third patterns BM2-1 may be disposed non-overlapping the first to third pixel regions PXA-R, PXA-G and PXA-B.

The fourth patterns BM2-2 may be disposed to overlap or correspond to the third pixel region PXA-B. The fourth patterns BM2-2 may be disposed to be spaced apart from each other along the third pixel region PXA-B. That is, the fourth patterns BM2-2 may overlap a first portion of the third pixel region PXA-B and expose a second portion of the third pixel region PXA-B to outside the fourth patterns BM2-2.

The third patterns BM2-1 and the fourth patterns BM2-2 may have different positions along the display panel DP, but may include a same material as each other. The third patterns BM2-1 and the fourth patterns BM2-2 may be in a same layer as each other (e.g., a second color pattern layer or first light shielding layer).

The third divided pattern BM3 (e.g., fifth pattern) may be disposed on the bottom surface of the second base substrate BS2. A plurality of the third divided patterns BM3 may be disposed on the bottom surface of the second divided pattern BM2. The third divided pattern BM3 may overlap or correspond to the peripheral region NPXA. The third divided patterns BM3 may be in a same layer as each other (e.g., a third color pattern layer or second light shielding layer).

The third divided pattern BM3 may include a light shielding material. In an embodiment, for example, the third divided pattern BM3 may include a black material. In an embodiment, for example, the third divided pattern BM3 may include a black pigment and a black dye. The black material may include carbon black, a metal such as chrome (Cr) or an oxide thereof.

The third divided pattern BM3 may be disposed between any two units adjacent to each other along the second base substrate BS2 among the first to third pixel regions PXA-R, PXA-G and PXA-B. The third divided pattern BM3 may include the light shielding material to reduce or effectively prevent the light scattered in the first to third pixel regions PXA-R, PXA-G and PXA-B from entering an adjacent pixel region among the first to third pixel regions PXA-R, PXA-G and PXA-B. That is, the third divided pattern BM3 may reduce or effectively prevent the light scattered in the first to third pixel regions PXA-R, PXA-G and PXA-B from being mixed.

Referring to the first pixel region PXA-R, the plurality of second patterns BM1-2 may be disposed to be spaced apart from each other in the first pixel region PXA-R. The plurality of first metal patterns MP1 may be disposed to be spaced apart from each other in the first pixel region PXA-R.

In addition, the second pattern BM1-2, the first color filter CF-R and the first metal pattern MP1 may be disposed in order from the bottom surface of the second base substrate BS2. The first metal pattern MP1 may be disposed to overlap or be aligned with the second pattern BM1-2.

The display panel DP may include the second pattern BM1-2 and the first metal patterns MP1 disposed to overlap the first pixel region PXA-R to reduce an aperture ratio of the first pixel region PXA-R. The aperture ratio herein, unless otherwise defined, may be proportional to a spaced distance between the first divided patterns BM1 along the second base substrate BS2. In an embodiment, for example, in the first pixel region PXA-R, the plurality of second patterns BM1-2 between two of the first patterns BM1-1 are disposed to be spaced apart from each other so that the aperture ratio may be reduced compared to the case where only the first patterns BM1-1 are disposed.

When the aperture ratio of the first pixel region PXA-R is reduced, the region in which the external light may enter the first light control unit CCF-R is reduced and the reflectivity in which the external light is reflected by the scattering particles SC may be decreased. In addition, the light entered towards the second patterns BM1-2 in the first pixel region PXA-R from the plurality of light emitting elements EE may be reflected by the first metal patterns MP1 back towards the first base substrate BS1 and may be converted into the first color light by the first quantum dots QD1 and the scattering particles SC to be finally emitted out of the display panel DP.

Therefore, one or more embodiment of the display panel DP includes the second patterns BM1-2 and the first metal patterns MP1 corresponding to each other, and thus the reflectivity of the external light may be reduced while the luminous efficiency inside the first pixel region PXA-R may be maintained.

Referring to the second pixel region PXA-G, the plurality of second patterns BM1-2 may be disposed to be spaced apart from each other in the second pixel region PXA-G. The plurality of first metal patterns MP1 may be disposed to be spaced apart from each other in the second pixel region PXA-G.

In addition, the second pattern BM1-2, the second color filter CF-G, and the first metal pattern MP1 may be disposed in order from the bottom surface of the second base substrate BS2. The first metal pattern MP1 may be disposed to overlap or be aligned with the second pattern BM1-2.

As described above with respect to the first pixel region PXA-R, the display panel DP includes the second patterns BM1-2 and the first metal patterns MP1 which are disposed to overlap the second pixel region PXA-G, and thus the reflectivity of the external light may be reduced while the luminous efficiency of the second pixel region PXA-G may be maintained.

Referring to the third pixel region PXA-B, the plurality of fourth patterns BM2-2 may be disposed to be spaced apart from each other in the third pixel region PXA-B. The plurality of first metal patterns MP1 may be disposed to be spaced apart from each other in the third pixel region PXA-B.

Since the third color filter CF-B has an integrated shape with the first divided pattern BM1, unlike the first and second pixel regions PXA-R and PXA-G, the third pixel region PXA-B includes the fourth patterns BM2-2 and thus the aperture ratio may be reduced. In the third pixel region PXA-B, the aperture ratio may be proportional to a spaced distance between the second divided patterns BM2. In an embodiment, for example, in the third pixel region PXA-B, two of the fourth patterns BM2-2 which are disposed between two of the third patterns BM2-1 are spaced apart from each other so that the aperture ratio may be reduced compared to the case where only two of the third patterns BM2-1 are disposed.

In addition, the third color filter CF-B, the fourth patterns BM2-2 and the first metal pattern MP1 may be disposed in order from the bottom surface of the second base substrate BS2. The first metal pattern MP1 may be disposed to overlap or be aligned with the fourth pattern BM2-2.

As described above with respect to the first and second pixel regions PXA-R and PXA-G, one or more embodiment of the display panel DP includes the fourth patterns BM2-2 and the first metal patterns MP1 in the third pixel region PXA-B, and thus the reflectivity of the external light may be reduced while the luminous efficiency of the third pixel region PXA-B may be maintained.

Figure 5:
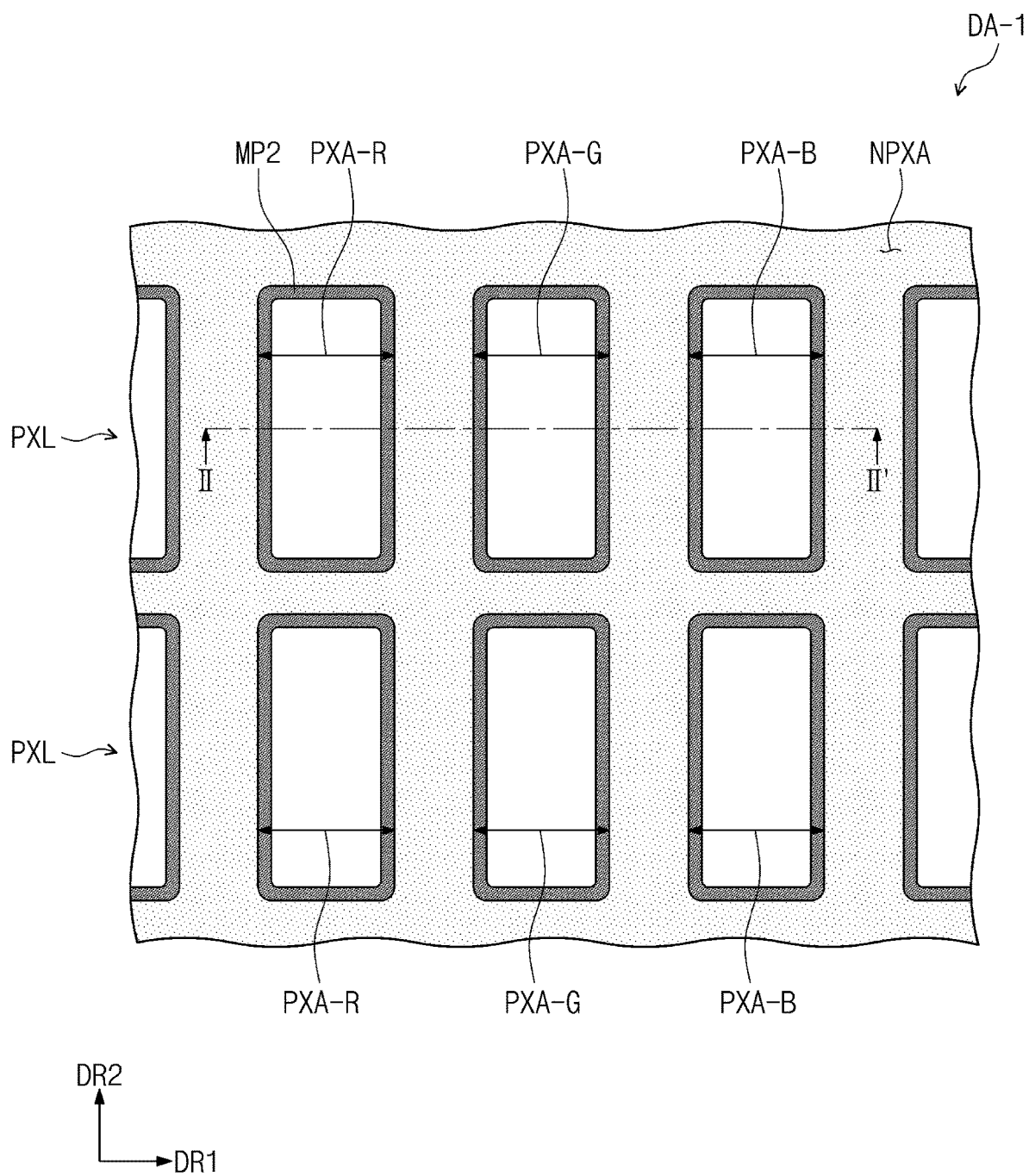
FIG. 5 is a plan view of an embodiment of a display region of a display panel.
Figure 6:
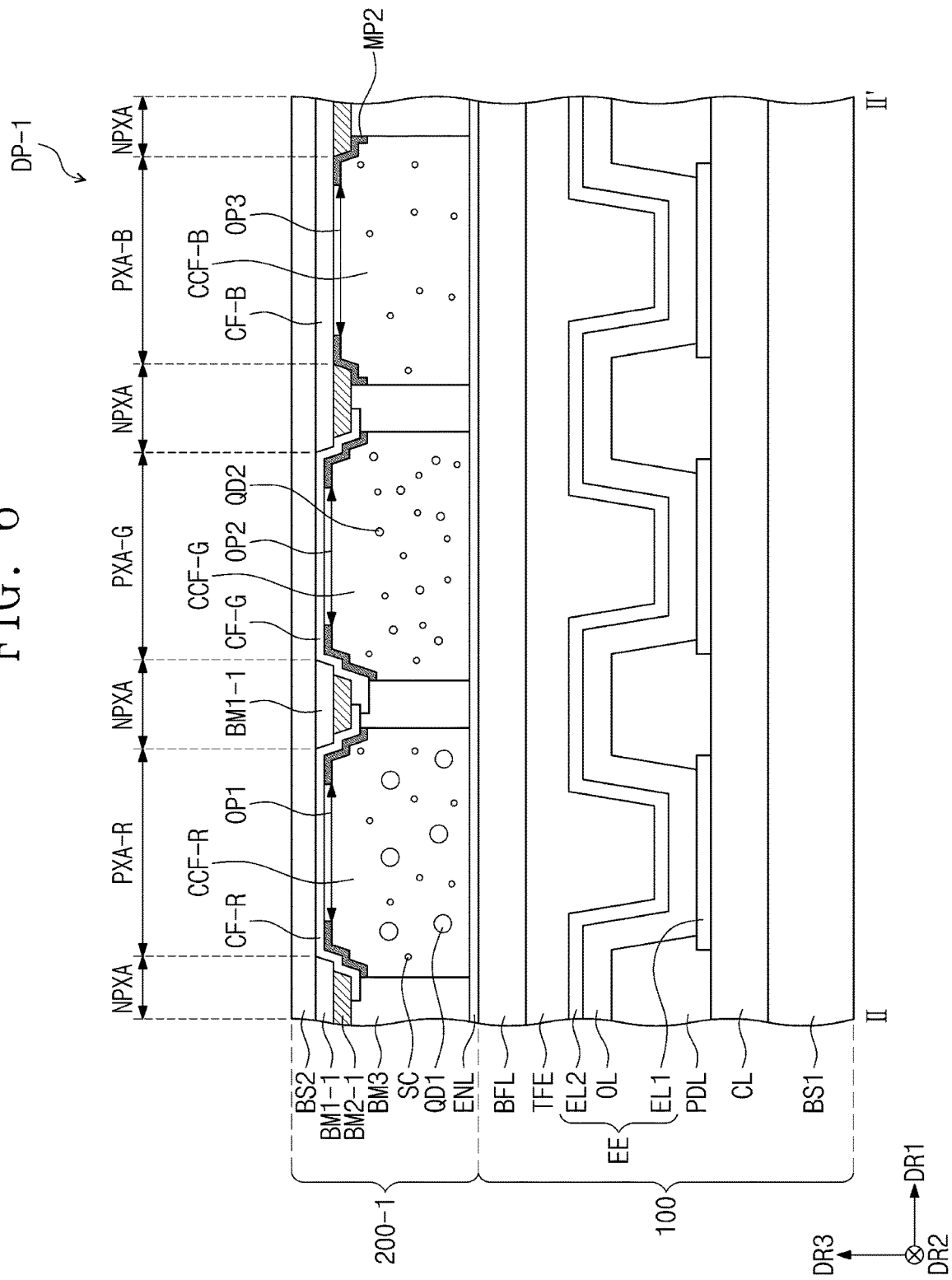
FIG. 6 is a cross-sectional view taken along line II-II' of FIG. 5.

FIG. 5 is a plan view of an embodiment of a display region DA-1. FIG. 6 is a cross-sectional view taken along line II-II' of FIG. 5. The same descriptions may be applied to the same constitution as FIGS. 1A to 4.

As shown in FIG. 5, within a second substrate 200-1, a second metal pattern MP2 may be provided in plural including a plurality of second metal patterns MP2 respectively disposed inside the first to third pixel regions PXA-R, PXA-G and PXA-B. The second metal patterns MP2 may be respectively extended along a boundary of the first to third pixel regions PXA-R, PXA-G and PXA-B to be adjacent to the peripheral region NPXA. The second metal pattern MP2 may extend inward from the boundary of a respective pixel region to reduce the maximum opening thereof. The second metal pattern MP2 may extend inward from a boundary between the peripheral region NPXA and each of the first to third pixel regions PXA-R, PXA-G and PXA-B, respectively, and in a direction away from the peripheral region NPXA of a respective pixel region.

In an embodiment, a respective pixel region may have a maximum opening through which light may transmit. The maximum opening may be defined between the third patterns BM2-1 at boundaries of the respective pixel region, between third divided patterns BM3 at boundaries of the respective pixel region, etc. but is not limited thereto. Referring to FIG. 4, at a same pixel region, the first metal patterns MP1 occupy a planar area of the maximum opening to reduce the opening through which light may transmit. The first metal patterns MP1 define an opening therebetween, and a first metal pattern MP1 and a third pattern BM2-1 at a boundary of a respective pixel region also defines an opening therebetween. Each of these openings may be smaller than the maximum opening described above. Each of these openings exposes a portion of a respective color filter.

Referring to FIG. 6, each of the first to third color filters CF-R, CF-G and CF-B may be disposed on a bottom surface of the second base substrate BS2, and the second metal patterns MP2 may be disposed on a bottom surface of the first to third color filters CF-R, CF-G and CF-B.

In FIG. 6, at a same pixel region, the second metal patterns MP2 occupy a planar area of the maximum opening of the same pixel region to reduce the opening through which light may transmit at the same pixel region. The second metal pattern MP2 defines first to third openings OP1, OP2 and OP3, which expose at least a portion of the first to third color filters CF-R, CF-G and CF-B, respectively. Each of these openings may be smaller than the maximum opening of the same pixel region.

Specifically, referring to the first pixel region PXA-R, the first color filter CF-R and the second metal pattern MP2 may be disposed in order from the bottom surface of the second base substrate BS2. The first opening OP1, which exposes a portion of the bottom surface of the first color filter CF-R, may be defined by the second metal pattern MP2.

Referring to the second pixel region PXA-G, the second color filter CF-G and the second metal pattern MP2 may be disposed in order from the bottom surface of the second base substrate BS2. The second opening OP2, which exposes a portion of the bottom surface of the second color filter CF-G, may be defined by the second metal pattern MP2.

Referring to the third pixel region PXA-B, the third color filter CF-B and the second metal pattern MP2 may be disposed in order from the bottom surface of the second base substrate BS2. The third opening OP3, which exposes a portion of the bottom surface of the third color filter CF-B, may be defined by the second metal pattern MP2.

The first to third pixel regions PXA-R, PXA-G and PXA-B include the second metal pattern MP2, so that the opening through which light transmits at each pixel region may be reduced to the first to third opening OP1, OP2 and OP3, respectively. Thus, a planar area in which external light may enter the first to third light control units CCF-R, CCF-G and CCF-B may be reduced.

When the light from inside of the first to third light control units CCF-R, CCF-G and CCF-B is incident to the second metal pattern MP2, the light is reflected back by the first quantum dot QD1, the second quantum dot QD2 and/or the scattering particles SC to emit the first color light, the second color light and the third color light.

Accordingly, one or more embodiment of the display panel DP-1 includes the second metal patterns MP2 so that the reflectivity of the external light may be reduced and the luminous efficiency inside the display panel DP-1 may be maintained.

Figure 7:
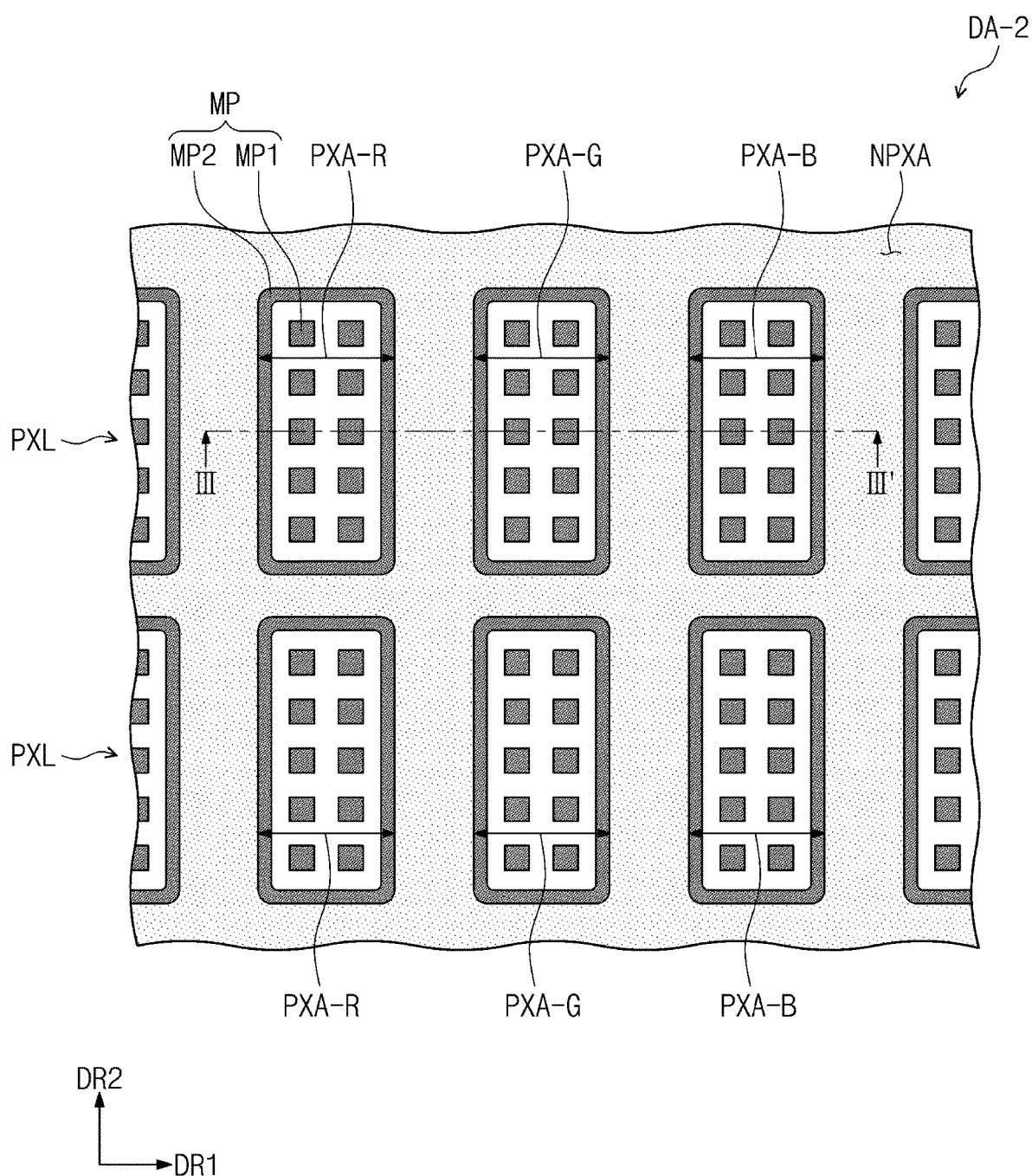
FIG. 7 is a plan view of an embodiment of a display region of a display panel.
Figure 8:
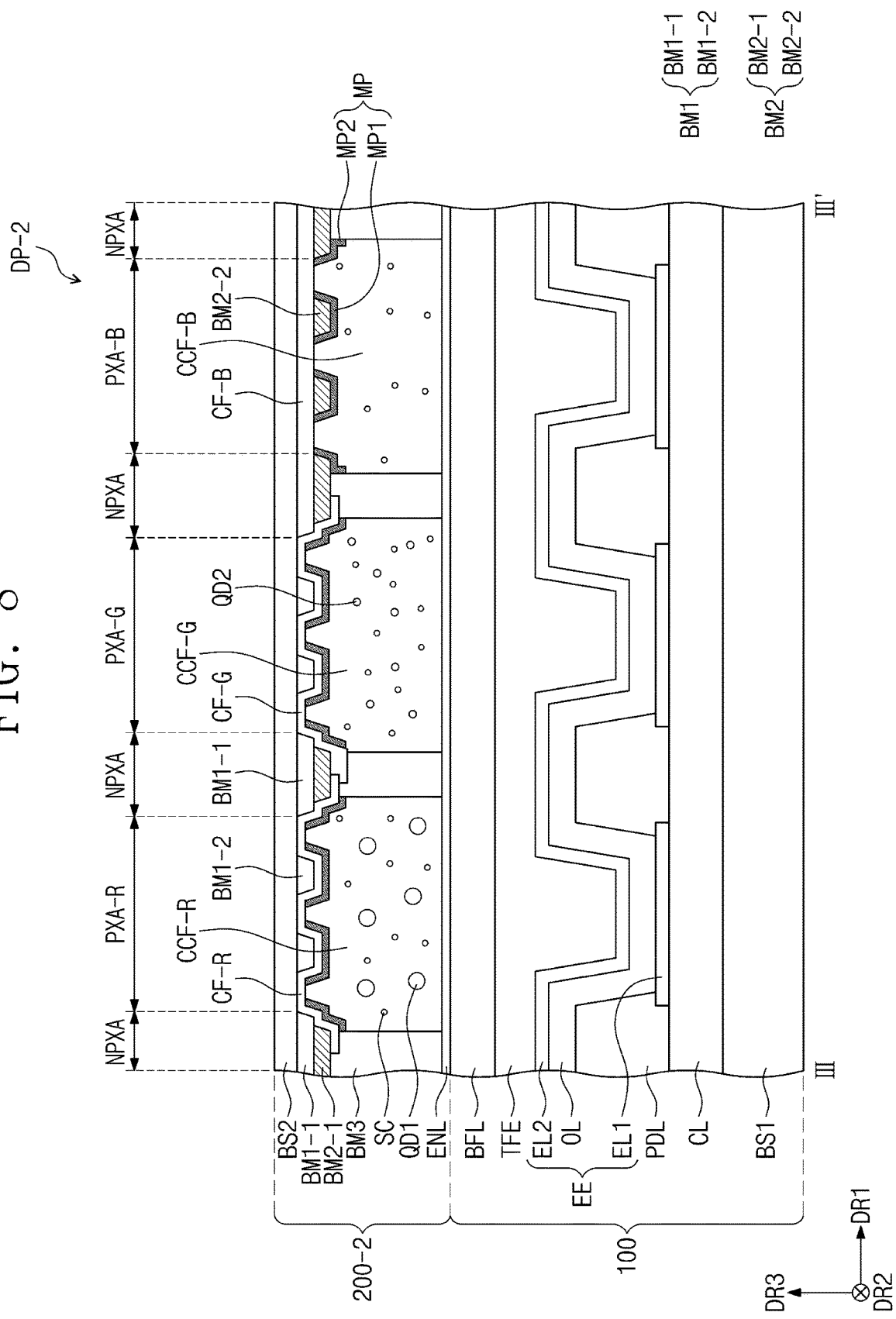
FIG. 8 is a cross-sectional view taken along line III-III' of FIG. 7.

FIG. 7 is a plan view of an embodiment of a display region DA-2. FIG. 8 is a cross-sectional view taken along line III-III' of FIG. 7. The same descriptions may be applied to the same constitution as FIGS. 1A to 6.

As shown in FIG. 7, within a second substrate 200-2, the metal patterns MP may be disposed in the first to third pixel regions PXA-R, PXA-G and PXA-B. The metal patterns MP may include the first metal patterns MP1 (see FIG. 3) and the second metal patterns MP2 (see FIG. 5).

Referring to FIG. 8, in the display panel DP-2, the first metal patterns MP1 and the second metal patterns MP2 each may be disposed to overlap the first to third pixel regions PXA-R, PXA-G and PXA-B.

The display panel DP-2 of FIG. 8 includes the first metal patterns MP1, the second metal patterns MP2, the second patterns BM1-2 and the fourth patterns BM2-2 as described with respect to the display DP of FIG. 4 and the display panel DP-1 of FIG. 6 so that the openings of the first to third pixel regions PXA-R, PXA-G and PXA-B may be reduced, the reflectivity of the external light may be reduced, and the luminous efficiency inside the display panel DP-2 may be maintained.

Figure 9:
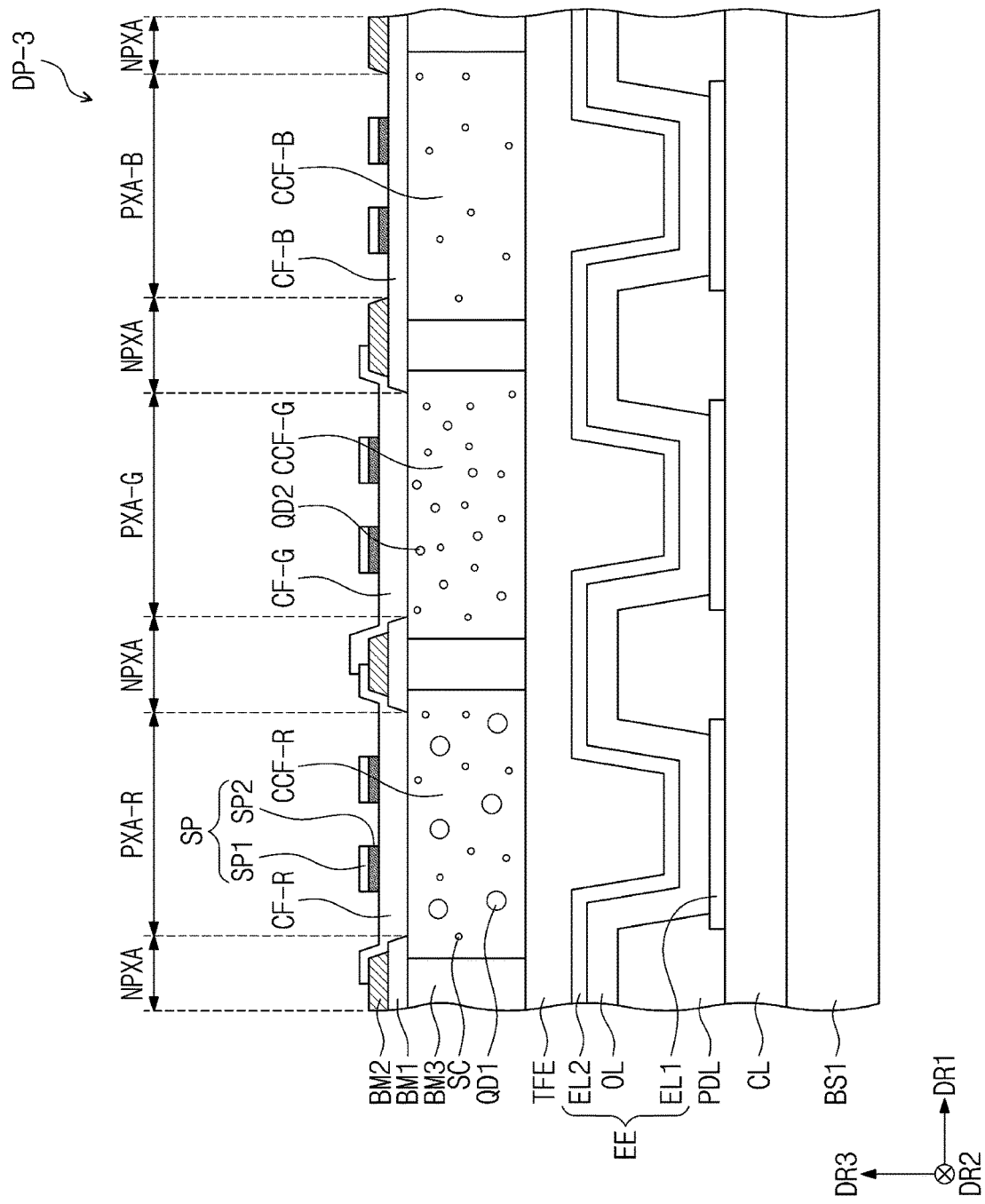
FIG. 9 is a cross-sectional view of an embodiment of a display panel.

FIG. 9 is a plan view of an embodiment of a display panel DP-3.

In the display panel DP-3, the first to third light control units CCF-R, CCF-G and CCF-B and the first to third color filters CF-R, CF-G and CF-B may within the thin film encapsulation layer TFE in a continuous process.

A plurality of light shielding patterns SP are disposed to overlap the first to third pixel regions PXA-R, PXA-G and PXA-B. In an embodiment, for example, the first to third color filters CF-R, CF-G, and CF-B are between the plurality of light shielding patterns SP and the first to third light control units CCF-R, CCF-G and CCF-B, respectively. The plurality of light shielding patterns SP are disposed to be spaced apart from each other within a same pixel region.

The plurality of light shielding patterns SP each include a first light shielding pattern SP1 including a light shielding material (e.g., light shielding layer) and a second light shielding pattern SP2 including a metal (e.g., metal layer). The first light shielding pattern SP1 is disposed further from the light emitting elements EE than the second light shielding pattern SP2.

The first light shielding pattern SP1 may include at least one of a blue material and a black material. In an embodiment, for example, when the first light shielding pattern SP1 includes a blue material, those features described with respect to the second pattern BM1-2 may be equally applied to the first light shielding pattern SP1. Alternatively, when the first light shielding pattern SP1 includes a black material, those features described with respect to the fourth pattern BM2-2 may be equally applied to the first light shielding pattern SP1.

Like the second pattern BM1-2 (FIG. 4) or the fourth pattern BM2-2 (FIG. 4) as described above, the first light shielding pattern SP1 may serve to reduce a dimension of the openings of the first to third pixel regions PXA-R, PXA-G and PXA-B through which light is transmitted and reduce the reflectivity of the external light.

The same descriptions on the first metal pattern MP1 (FIG. 4) may be applied to the second light shielding pattern SP2. Although the light inside the first to third light control units CCF-R, CCF-G and CCF-B may be emitted towards the first light shielding pattern SP1, the light may be reflected at the second light shielding pattern SP2 to be emitted out of the display panel DP-3.

Therefore, one or more embodiment of the display panel DP-3 includes the plurality of light shielding patterns SP so that the reflectivity of the external light may be reduced and the luminous efficiency of the first to third pixel regions PXA-R, PXA-G and PXA-B may be maintained.

FIG. 9 illustrates that the first divided pattern BM1 and the second divided pattern BM2 are in different layers within the display panel DP-3, but the invention is not limited thereto. In an embodiment, the first divided pattern BM1 and the second divided pattern BM2 may have an integrated shape (e.g., be in a same layer as each other) and include a black material.

The second metal patterns MP2 as described in FIG. 6 are not shown in FIG. 9, but the description thereof may be applied to the light shielding patterns SP as needed. Those features described in FIGS. 1A to 8 may be equally applied to other embodiments.

FIGS. 10, 11, 12 and 13 are plan views of embodiments of various display regions.

The planar shapes of the first metal patterns MP1 (see FIGS. 3, 4, 7 and 8) and the second metal patterns MP2 (see FIGS. 5 to 8) are not limited to the embodiments of FIGS. 3 to 9 as described above, and may be variously adjusted.

Along the base substrate BS1, the first metal pattern MP1 includes a dimension along the first direction DR1 and a dimension along the second direction DR2 which define a size or planar area of the first metal pattern MP1. In embodiments, for example, the size of the first metal pattern MP1 may be variously adjusted.

Figure 10:
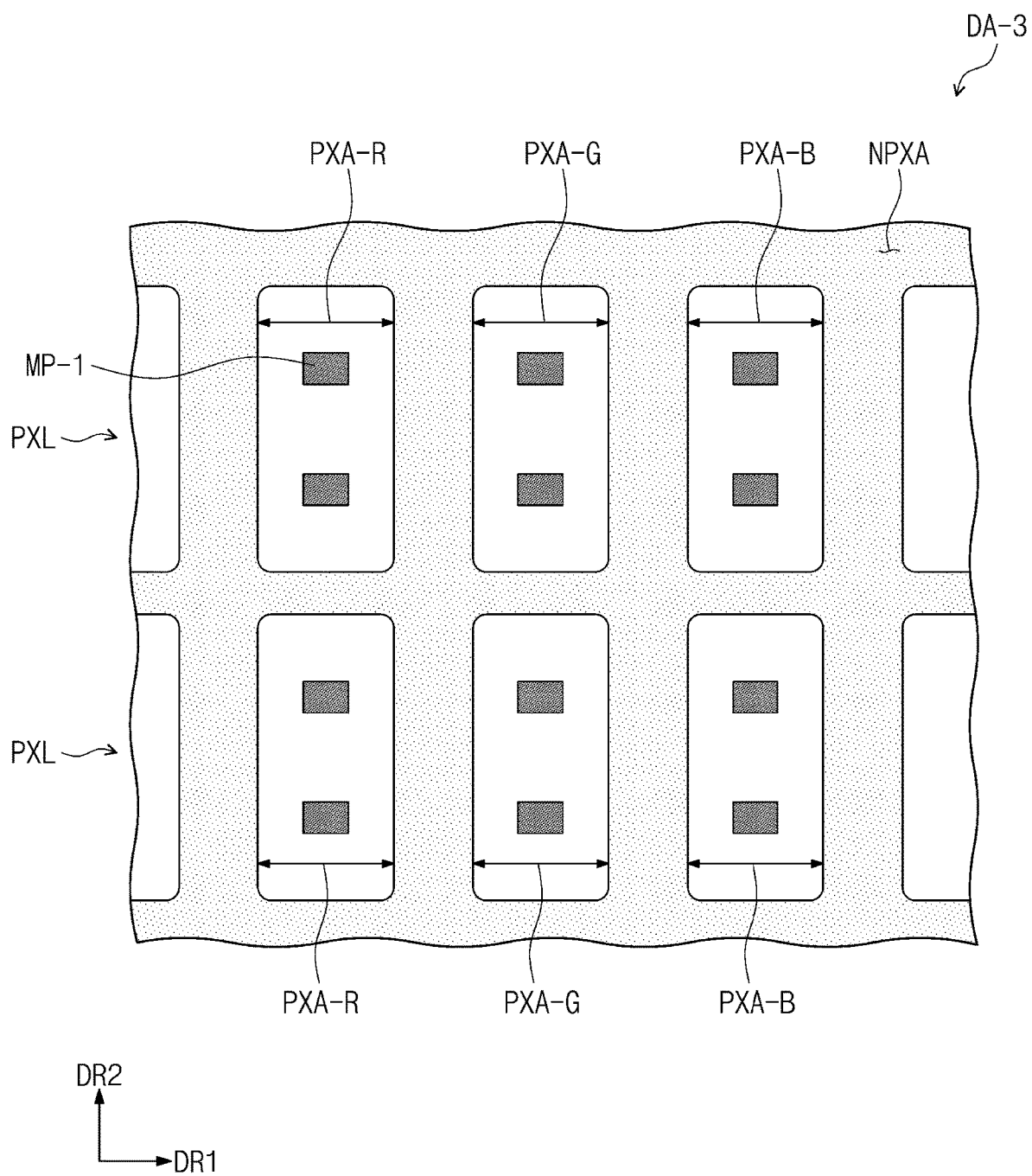
FIGS. 10, 11, 12 and 13 are plan views of embodiments of display regions of a display panel.

FIG. 10 is a plan view of an embodiment of a display region DA-3. Referring to FIGS. 3 and 10, third metal patterns MP-1 of FIG. 10 may have a square shape as the first metal patterns MP1 of FIG. 3 and the size (or planar area) thereof may be increased. FIG. 10 illustrates that the two of the third metal patterns MP-1 are disposed in each of the first to third pixel regions PXA-R, PXA-G and PXA-B, but the number of the third metal patterns MP-1 is not limited thereto. In an embodiment, a single one or a plurality of the third metal patterns MP-1 may be disposed within a respective pixel region.

Figure 11:
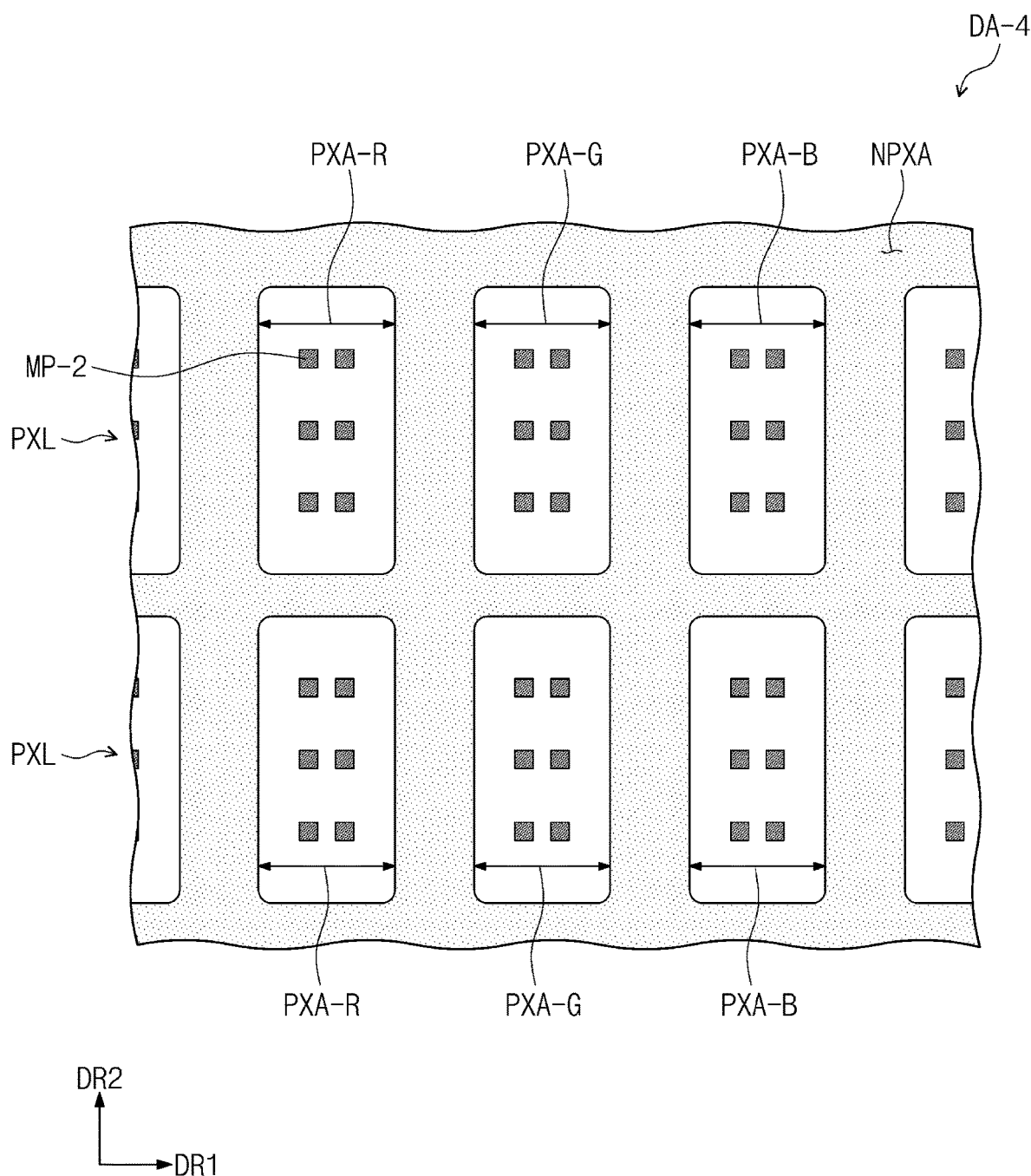

FIG. 11 is a plan view of an embodiment of a display region DA-4. Referring to FIGS. 3 and 11, fourth metal patterns MP-2 of FIG. 11 may have a square shape as the first metal patterns MP1 and the size thereof may be decreased. FIG. 11 illustrates that six of the fourth metal patterns MP-2 are disposed in each of the first to third pixel regions PXA-R, PXA-G and PXA-B, but the number of the fourth metal patterns MP-2 is not limited thereto. In an embodiment, a single one or a plurality of the fourth metal patterns MP-2 may be disposed within a respective pixel region.

Figure 12:
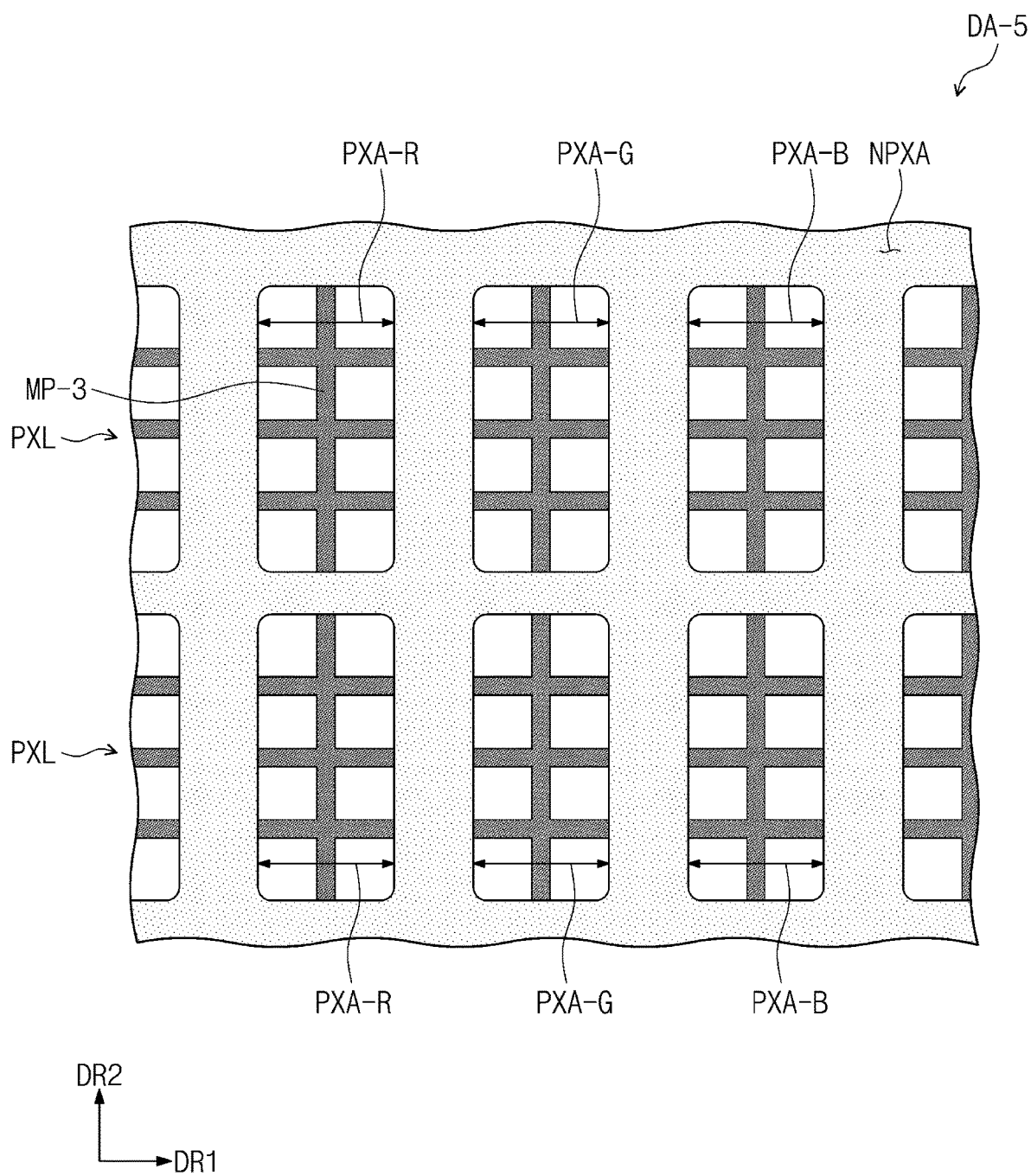

FIG. 12 is a plan view of an embodiment of a display region DA-5. Referring to FIG. 12, the fifth metal patterns MP-3 may have a net shape (or a mesh shape) which is disposed in each of the first to third pixel regions PXA-R, PXA-G and PXA-B. In an embodiment, for example, the fifth metal patterns MP-3 may have solid portions defining one center column (e.g., stem portion) disposed at a center extending along the second direction DR2 of each of the first to third pixel regions PXA-R, PXA-G and PXA-B and a plurality of rows (e.g., branch portion) extending along the first direction DR1 from the center column. However, the invention is not limited thereto, and the fifth metal patterns MP-3 may include a shape having a plurality of center columns and a plurality of rows.

Figure 13:
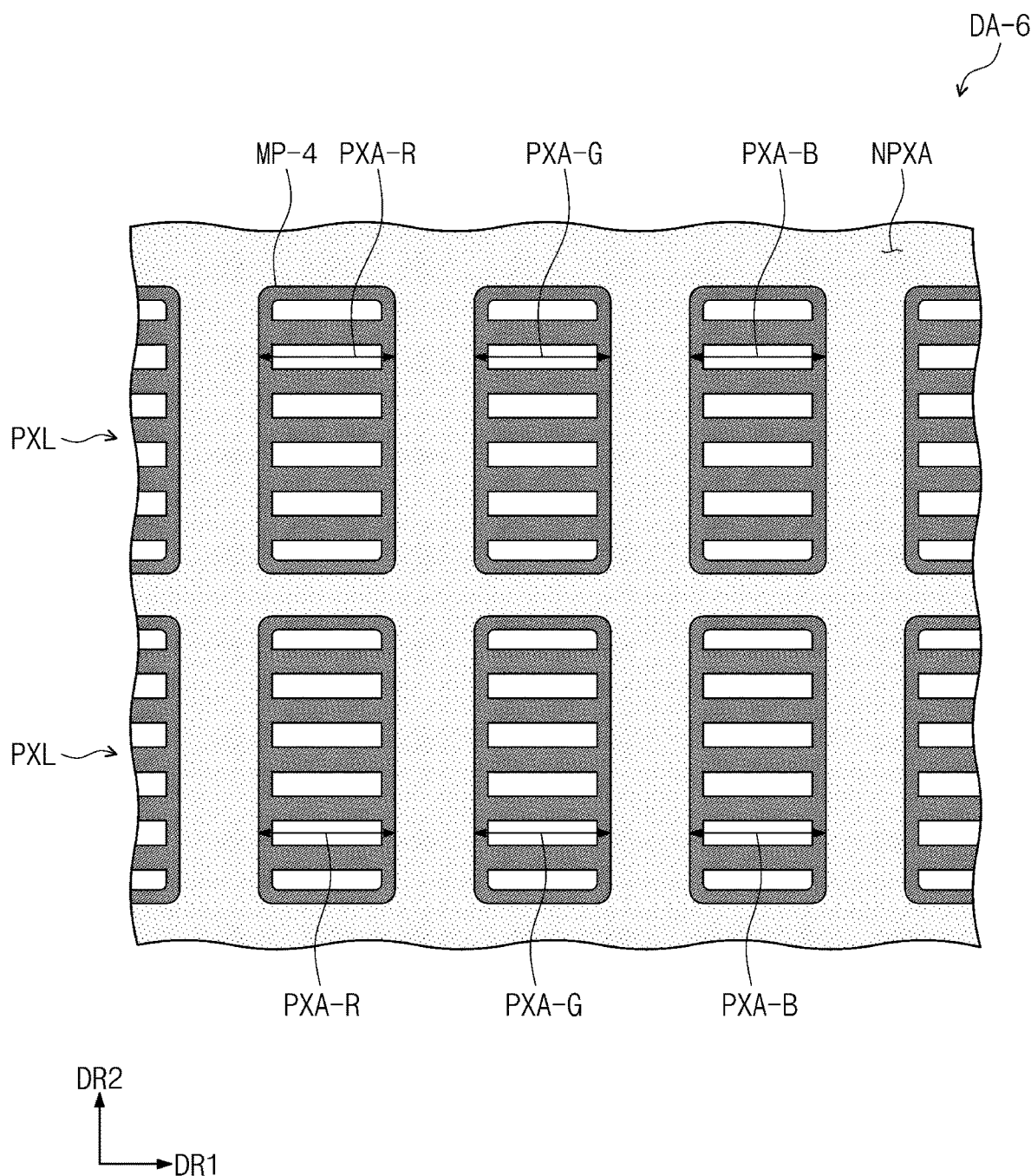

FIG. 13 is a plan view of an embodiment of a display region DA-6. Referring to FIG. 13, the sixth metal patterns MP-4 may have a stripe shape which is disposed in each of the first to third pixel regions PXA-R, PXA-G and PXA-B. In an embodiment, for example, the sixth metal patterns MP-4 may include a plurality of rows extending from a boundary portion (see FIG. 5) in each of the first to third pixel regions PXA-R, PXA-G and PXA-B. However, the invention is not limited thereto, and the sixth metal patterns MP-4 may extend along the second direction DR2 to define a plurality of columns extended from a boundary portion.

As exemplarily illustrated in FIGS. 10 to 13, the third metal patterns MP-1, the fourth metal patterns MP-2, the fifth metal patterns MP-3 and the sixth metal patterns MP-4 may have various shapes within a respective pixel region. In addition, a shape of the second patterns BM1-2 (see FIG. 4) and the fourth patterns BM2-2 (see FIG. 4) as the light shielding member may be disposed to overlap or correspond to a shape of the third metal patterns MP-1, the fourth metal patterns MP-2, the fifth metal patterns MP-3. and/or the sixth metal patterns MP-4.

An evaluation of the reflectivity and the luminous efficiency in percent (%) according to a reduction of the aperture ratio in percent (%) of a display panel DP is shown in Table 1 below.

Example 1 is the display panel DP-1 of the embodiment illustrated in FIGS. 5 and 6. Example 2 is the display panel DP-2 of the embodiment illustrated in FIGS. 7 and 8.

Comparative Examples 1 and 2 is a conventional display panel in which a separate metal pattern or a separate light shielding pattern is not disposed or excluded from a respective pixel region.

The luminous efficiency is the luminous efficiency of an evaluated display panel, which is listed assuming that the luminous efficiency of Comparative Example 2 is 100%. Specular component included ("SCI") and specular component excluded ("SCE") are the reflectivity in percent (%) of the external light entering the evaluated display panel, which is listed assuming that the reflectivity of Comparative Example 2 is 100%.

TABLE 1

| Division | Example 1 | Example 2 | Comparative Example 1 | Comparative Example 2 |
|---|---|---|---|---|
| Aperture ratio (%) | 34.6 | 34.3 | 47.6 | 34.3 |
| Luminous efficiency (%) | 108.0 | 90.5 | 127.7 | 100 |
| SCI/SCE(%) | 96.9/98.6 | 85.2/79.2 | 131.3/148.6 | 100/100 |

Referring to Table 1 above, with respect to the display panel DP-1 of Example 1, the aperture ratio is 34.6%, which is reduced from 47.6% of Comparative Example 1. As the aperture ratio is reduced, the luminous efficiency of Example 1 is 108.0%, which is reduced from 127.7% of Comparative Example 1. The reflectivity of the external light is reduced from 131.3 to 96.9% with respect to SCI, and the reflectivity of the external light is reduced from 148.6% to 98.6% with respect to SCE. With respect to Example 1, as the aperture ratio is reduced, the luminous efficiency is about 84.6% of that of Comparative Example 1, but the reflectivity of the external light is 66.4% (on the basis of SCE) of that of Comparative Example 1. Thus, it may be confirmed that the reflectivity of the external light is reduced more than the luminous efficiency.

When comparing Example 1 and Comparative Example 2, the aperture ratios are 34.6% and 34.3%, respectively, which are reduced compared to Comparative Example 1, but it may be confirmed that Example 1 including the metal patterns MP has a luminous efficiency of 108% higher than Comparative Example 2 and reflectivities of 96.9%/98.6% lower than Comparative Example 2.

With respect to the display panel DP-2 of Example 2, the aperture ratio is 34.3%, which is reduced from 47.6% of Comparative Example 1. As the aperture ratio is reduced, the luminous efficiency of Example 2 is 90.5%, which is reduced from 127.7% of Comparative Example 1. The reflectivity of the external light is reduced from 131.3% to 85.2% with respect to SCI, and is reduced from 148.6% to 79.2% with respect to SCE.

With respect to Example 2, as the aperture ratio is reduced, the luminous efficiency is about 70.9% of that of Comparative Example 1, but the reflectivity of the external light is 53.3% (on the basis of SCE) of that of Comparative Example 1. Thus, it may be confirmed that the reflectivity is reduced more than the luminous efficiency.

When comparing Example 2 and Comparative Example 2, both of the aperture ratios are 34.3%, which are equally reduced compared to the aperture ratio of Comparative Example 1. It may be confirmed that Example 2 including the metal patterns MP has a luminous efficiency of 90.5%, which is about 10% lower than Comparative Example 2 and the reflectivity with respect to SCE is 79.2%, which is over 20% lower than Comparative Example 2.

According to Table 1, the evaluated display panels of Examples 1 and 2 may reduce the reflectivity of the external light considerably while maintaining the luminous efficiency compared to Comparative Examples 1 and 2 which do not include (e.g., exclude) metal patterns MP within a respective pixel region and in which the aperture ratio is not reduced by the metal patterns MP.

One or more embodiment of a display panel DP includes the first divided pattern BM1 and the second divided pattern BM2, or the first light shielding patterns SP1, which are in the first to third pixel regions PXA-R, PXA-G and PXA-B, thereby reducing a size of openings of the first to third pixel regions PXA-R, PXA-G and PXA-B through which light is transmitted and reducing the reflectivity of the external light.

In addition, by including the first metal patterns MP1 and the second metal patterns MP2 or the second light shielding patterns SP2, which are in the first to third pixel regions PXA-R, PXA-G and PXA-B, the luminous efficiency of the first to third pixel regions PXA-R, PXA-G and PXA-B may be maintained.

One or more embodiment of the display panel DP may have improved luminous efficiency and reduced reflectivity of external light from outside the display panel DP.

Although the invention has been described with reference to embodiments, the invention should not be limited to these embodiments but various changes and modifications can be made by those skilled in the art without departing from the spirit and scope of the invention.

Accordingly, the technical scope of the invention is not intended to be limited to the contents set forth in the detailed description of the specification, but is intended to be defined by the appended claims.

What is claimed is:

1. A display panel comprising:
    a plurality of light emitting elements which generate source light;
    a first pixel region, a second pixel region and a third pixel region from which light is emitted;
    a peripheral region adjacent to the first pixel region, the second pixel region and the third pixel region;
    in order from the plurality of light emitting elements:
        a layer including a first light control pattern, a second light control pattern and a third light control pattern which correspond to the first pixel region, the second pixel region and the third pixel region, respectively, and
        a layer including a first color filter, a second color filter and a third color filter which correspond to the first light control pattern, the second light control pattern and the third light control pattern, respectively; and
    a first divided pattern which transmits the source light, the first divided pattern comprising:
        a first pattern which corresponds to the peripheral region and transmits the source light, and
        a second pattern which corresponds to the first pixel region and the second pixel regions and transmits the source light.

2. The display panel of claim 1, wherein the layer including the first color filter, the second color filter and the third color filter defines each of the first pattern and the second pattern of the first divided pattern.

3. The display panel of claim 1, further comprising a second divided pattern which shields the source light, the second divided pattern comprising:
    a third pattern corresponding to the peripheral region, and
    a fourth pattern corresponding to the third pixel region.

4. The display panel of claim 3, wherein each of the third pattern and the fourth pattern of the second divided pattern comprises a black material.

5. The display panel of claim 3, wherein the second divided pattern and the first divided pattern are in order from the plurality of light emitting elements.

6. The display panel of claim 3, further comprising a first metal pattern which corresponds to the second pattern of the first divided pattern or the fourth pattern of the second divided pattern,
    wherein the first metal pattern is closer to the plurality of light emitting elements than both of the second divided pattern and the first divided pattern.

7. The display panel of claim 6, wherein the first metal pattern has a mesh shape or a square shape.

8. The display panel of claim 1, further comprising:
a boundary between the peripheral region and each of the first pixel region, the second pixel region and the third pixel region, respectively, and
a second metal pattern which is extended along the boundary and in a direction away from the peripheral region,
wherein the second metal pattern defines a first opening, a second opening and a third opening of the first pixel region, the second pixel region and the third pixel region, at which the first color filter, the second color filter and the third color filter are exposed outside of the second metal pattern, respectively.

9. The display panel of claim 1, further comprising in each of the first pixel region, the second pixel region and the third pixel region, a layer including a plurality of metal patterns spaced apart from each other,
wherein the layer including the plurality of metal patterns is closer to the plurality of light emitting elements than each of the first pattern and the second pattern of the first divided pattern.

10. The display panel of claim 1, further comprising a third divided pattern which corresponds to the peripheral region and shields the source light,
wherein
the third divided pattern is respectively between the first light control pattern, the second light control pattern and the third light control pattern, and
the third divided pattern and the first divided pattern are in order from the plurality of light emitting elements.

11. The display panel of claim 10, wherein the third divided pattern comprises a black material.

12. The display panel of claim 1, wherein:
the source light includes third color light,
the first light control pattern converts the third color light to first color light which is different from the third color light,
the second light control pattern converts the third color light to second color light which is different from the third color light and the first color light,
the third light control pattern transmits the third color light, and
the first color filter transmits the first color light, the second color filter transmits the second color light and the third color filter transmits the third color light.

13. The display panel of claim 1, wherein the source light includes blue light.

14. The display panel of claim 1, wherein the plurality of light emitting elements each comprises:
a first electrode,
a second electrode facing the first electrode, and
an organic layer which is between the first electrode and the second electrode, the organic layer including an emission layer which generates the source light.

15. The display panel of claim 1, wherein
the plurality of light emitting elements comprises a first light emitting element, a second light emitting element and a third light emitting element corresponding to the first pixel region, the second pixel region and the third pixel region, respectively, and
the first light emitting element, the second light emitting element and the third light emitting element have an integrated shape.

16. The display panel of claim 1, wherein
the first light control pattern comprises a first base resin and a first quantum dot which is in the first base resin and has a size, the second light control pattern comprises a second base resin and a second quantum dot which is in the second base resin and has a size, and
the size of the first quantum dot is larger than the size of the second quantum dot.

17. A display panel comprising:
a plurality of light emitting elements which generate source light;
a plurality of pixel regions from which light is respectively emitted; and
in order from the plurality of light emitting elements:
a layer including a plurality of light control patterns which respectively correspond to the plurality of pixel regions,
a color filter layer including a plurality of color filters which respectively correspond to the plurality of light control patterns, and
a layer including a plurality of light shielding patterns which are respectively in the plurality of pixel regions, are spaced apart from each other within a respective pixel region, and spaced apart from each of the plurality of color filters in a direction along the color filter layer,
wherein the plurality of light shielding patterns each comprises in order from the color filter layer:
a first light shielding pattern including a metal material, and
a second light shielding pattern corresponding to the first light shielding pattern and including a light shielding material.

18. The display panel of claim 17, wherein:
the source light includes third color light,
the plurality of pixel regions includes a first pixel region and a second pixel region,
the plurality of light control patterns includes a first light control pattern and a second light control pattern which correspond to the first pixel region and the second pixel region, respectively,
the first light control pattern converts the third color light to first color light which is different from the third color light,
the second light control pattern transmits the third color light,
the plurality of color filter layers includes a first color filter and a second color filter which correspond to the first light control pattern and the second light control pattern, respectively, and
the first color filter transmits the first color light, and the second color filter light.

19. A display panel comprising:
a plurality of light emitting elements which generate source light;
a first pixel region, a second pixel region and a third pixel region from which light is emitted;
a layer including a first light control pattern, a second light control pattern and a third light control pattern which correspond to the first pixel region, the second pixel region and the third pixel region, respectively; and
a layer including a plurality of light shielding patterns which are in each of the first pixel region, the second pixel region and the third pixel region and are spaced apart from each other within a respective pixel region,
wherein the plurality of light shielding patterns each comprises:
a first light shielding pattern including a light shielding material, and a second light shielding pattern which corresponds to the first light shielding pattern, includes a metal material and is closer to the layer including the first light control pattern, the second light control pattern and the third light control pattern than the first light shielding pattern.

20. The display panel of claim 19, wherein the source light includes blue light, and the first light shielding pattern comprises a blue material or a black material.

* * * * *